US012261099B2

(12) United States Patent
Gao et al.

(10) Patent No.: US 12,261,099 B2
(45) Date of Patent: Mar. 25, 2025

(54) EMBEDDED COOLING SYSTEMS WITH COOLANT CHANNEL FOR DEVICE PACKAGING

(71) Applicant: Adeia Semiconductor Bonding Technologies Inc., San Jose, CA (US)

(72) Inventors: Guilian Gao, Campbell, CA (US); Belgacem Haba, Saratoga, CA (US); Laura Mirkarimi, Sunol, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 18/394,985

(22) Filed: Dec. 22, 2023

(65) Prior Publication Data

US 2024/0249998 A1 Jul. 25, 2024

Related U.S. Application Data

(60) Provisional application No. 63/435,145, filed on Dec. 23, 2022.

(51) Int. Cl.
*H01L 23/46* (2006.01)
*H01L 23/00* (2006.01)
(Continued)

(52) U.S. Cl.
CPC ............ *H01L 23/46* (2013.01); *H01L 23/053* (2013.01); *H01L 23/38* (2013.01); *H01L 24/08* (2013.01); *H01L 2224/08245* (2013.01)

(58) Field of Classification Search
CPC ...................................................... H01L 23/46
(Continued)

(56) References Cited

U.S. PATENT DOCUMENTS 4,274,479 A 6/1981 Eastman
5,309,986 A 5/1994 Itoh
(Continued)

FOREIGN PATENT DOCUMENTS

CN 109524373 A 3/2019
CN 111128976 A 5/2020
(Continued)

OTHER PUBLICATIONS

Evan G. Colgan, "A Practical Implementation Of Silicon Microchannel Coolers", available online at <https://www.electronics-cooling.com/2007/11/a-practical-implementation-of-silicon-microchannel-coolers/>, Nov. 1, 2007, 10 pages.
(Continued)

*Primary Examiner* — Ajay Arora
(74) *Attorney, Agent, or Firm* — HALEY GUILIANO LLP

(57) ABSTRACT

In some implementations, a device package may include a package substrate, a package cover disposed on the package substrate, and an integrated cooling assembly disposed between the package substrate and the package cover. The integrated cooling assembly may include a semiconductor device and a cold plate having a first side attached to the semiconductor device and a second side opposite the first side. An adhesive layer may be disposed between the package cover and the second side of the cold plate, and one or more surfaces of second side of the cold plate may be spaced apart from the package cover to define a coolant channel therebetween. The adhesive layer may seal the package cover to the cold plate around a perimeter of the coolant channel.

20 Claims, 14 Drawing Sheets

(51) Int. Cl.
*H01L 23/053* (2006.01)
*H01L 23/38* (2006.01)

(58) Field of Classification Search
USPC ..................................................... 257/713
See application file for complete search history.

(56) References Cited

U.S. PATENT DOCUMENTS

| | | |
|---|---|---|
| 5,522,452 A | 6/1996 | Mizuno et al. |
| 5,769,154 A | 6/1998 | Adkins et al. |
| 6,056,044 A | 5/2000 | Benson et al. |
| 6,351,384 B1 | 2/2002 | Daikoku et al. |
| 6,686,532 B1 | 2/2004 | Macris |
| 6,822,326 B2 | 11/2004 | Enquist et al. |
| 7,289,326 B2 | 10/2007 | Heydari et al. |
| 7,485,957 B2 | 2/2009 | Brandenburg et al. |
| 7,511,372 B2 | 3/2009 | Chiu |
| 7,523,617 B2 | 4/2009 | Venkatasubramanian et al. |
| 7,622,324 B2 | 11/2009 | Enquist et al. |
| 7,692,926 B2 | 4/2010 | Henderson et al. |
| 7,957,137 B2 | 6/2011 | Prasher |
| 7,978,473 B2 | 7/2011 | Campbell et al. |
| 7,997,087 B2 | 8/2011 | Venkatasubramanian et al. |
| 8,164,169 B2 | 4/2012 | Chrysler et al. |
| 8,630,091 B2 | 1/2014 | Ward et al. |
| 9,224,673 B2 | 12/2015 | Chen et al. |
| 9,299,641 B2 | 3/2016 | Sekar et al. |
| 9,355,932 B2 | 5/2016 | Ankireddi et al. |
| 9,391,143 B2 | 7/2016 | Tong et al. |
| 9,553,071 B1 | 1/2017 | Haba |
| 9,741,638 B2 | 8/2017 | Hsieh et al. |
| 9,741,696 B2 | 8/2017 | Katkar et al. |
| 9,746,248 B2 | 8/2017 | Semenov et al. |
| 9,768,149 B2 | 9/2017 | Vadhavkar et al. |
| 9,818,723 B2 | 11/2017 | Haba |
| 10,032,695 B2 | 7/2018 | Iyengar et al. |
| 10,083,934 B2 | 9/2018 | Haba |
| 10,157,818 B2 | 12/2018 | Chen et al. |
| 10,170,392 B2 | 1/2019 | Chainer et al. |
| 10,199,356 B2 | 2/2019 | Kinsley |
| 10,312,221 B1 | 6/2019 | Agarwal et al. |
| 10,332,823 B2 | 6/2019 | Chen et al. |
| 10,461,059 B2 | 10/2019 | Koopmans et al. |
| 10,694,641 B2 | 6/2020 | Basu et al. |
| 10,978,427 B2 | 4/2021 | Li et al. |
| 11,187,469 B2 | 11/2021 | Karesh |
| 11,387,164 B2 | 7/2022 | Wu et al. |
| 11,598,594 B2 | 3/2023 | Lewis et al. |
| 11,996,351 B2 | 5/2024 | Hsiao et al. |
| 2003/0157782 A1* | 8/2003 | Kellar .................... H01L 25/50 257/E21.705 |
| 2004/0184237 A1 | 9/2004 | Chang |
| 2004/0251530 A1 | 12/2004 | Yamaji |
| 2005/0126766 A1 | 6/2005 | Lee et al. |
| 2005/0213301 A1* | 9/2005 | Prasher .................. H01L 23/38 257/E23.098 |
| 2006/0042825 A1 | 3/2006 | Lu et al. |
| 2006/0103011 A1 | 5/2006 | Andry et al. |
| 2007/0025082 A1 | 2/2007 | Lee et al. |
| 2007/0107875 A1 | 5/2007 | Lee et al. |
| 2008/0096320 A1 | 4/2008 | Farrar |
| 2009/0122491 A1 | 5/2009 | Martin et al. |
| 2010/0116534 A1* | 5/2010 | Choi ................ H01L 23/49816 29/839 |
| 2010/0230805 A1 | 9/2010 | Refai-Ahmed |
| 2010/0300202 A1 | 12/2010 | Joyce |
| 2011/0129986 A1 | 6/2011 | Libralesso et al. |
| 2013/0044431 A1 | 2/2013 | Koeneman |
| 2013/0050944 A1 | 2/2013 | Shepard |
| 2013/0087904 A1 | 4/2013 | Clark et al. |
| 2014/0126150 A1 | 5/2014 | Song et al. |
| 2015/0194363 A1 | 7/2015 | Jun et al. |
| 2016/0276314 A1 | 9/2016 | Ching et al. |
| 2017/0012016 A1 | 1/2017 | Joshi et al. |
| 2017/0092565 A1 | 3/2017 | Chen et al. |
| 2017/0103937 A1 | 4/2017 | Hsieh et al. |
| 2018/0053730 A1 | 2/2018 | Shao et al. |
| 2018/0087842 A1 | 3/2018 | Chainer et al. |
| 2018/0090427 A1 | 3/2018 | Bernstein et al. |
| 2018/0160565 A1 | 6/2018 | Parida |
| 2018/0211900 A1 | 7/2018 | Gutala et al. |
| 2018/0308783 A1 | 10/2018 | Refai-Ahmed et al. |
| 2019/0008071 A1 | 1/2019 | Kim |
| 2019/0355706 A1 | 11/2019 | Enquist et al. |
| 2019/0385928 A1 | 12/2019 | Leobandung |
| 2020/0035583 A1 | 1/2020 | Beauchemin et al. |
| 2020/0105639 A1 | 4/2020 | Valavala et al. |
| 2020/0312742 A1 | 10/2020 | Lofgreen et al. |
| 2020/0343160 A1 | 10/2020 | Mizerak et al. |
| 2020/0350233 A1 | 11/2020 | Mizerak et al. |
| 2020/0352053 A1 | 11/2020 | Mizerak et al. |
| 2020/0395313 A1 | 12/2020 | Mallik et al. |
| 2021/0066164 A1 | 3/2021 | Wu et al. |
| 2021/0175143 A1 | 6/2021 | Yu et al. |
| 2021/0183741 A1 | 6/2021 | Jha et al. |
| 2021/0193548 A1 | 6/2021 | Wan et al. |
| 2021/0193620 A1 | 6/2021 | Refai-Ahmed et al. |
| 2021/0280497 A1 | 9/2021 | Brun et al. |
| 2021/0288037 A1 | 9/2021 | Tao et al. |
| 2021/0378106 A1* | 12/2021 | Iyengar ................. H01L 23/36 |
| 2021/0378139 A1 | 12/2021 | Rice et al. |
| 2021/0410329 A1 | 12/2021 | Yang et al. |
| 2022/0037231 A1 | 2/2022 | Hsiao et al. |
| 2022/0087059 A1 | 3/2022 | Sathyamurthy et al. |
| 2022/0117115 A1 | 4/2022 | Malouin et al. |
| 2022/0130734 A1 | 4/2022 | Chiu et al. |
| 2022/0189850 A1 | 6/2022 | Liff et al. |
| 2022/0210949 A1 | 6/2022 | Edmunds et al. |
| 2022/0230937 A1 | 7/2022 | Malouin et al. |
| 2022/0408592 A1 | 12/2022 | Malouin et al. |
| 2023/0048500 A1 | 2/2023 | Malouin et al. |
| 2023/0154828 A1 | 5/2023 | Haba et al. |
| 2023/0156959 A1 | 5/2023 | Malouin et al. |
| 2023/0207474 A1 | 6/2023 | Uzoh et al. |
| 2023/0245950 A1 | 8/2023 | Haba et al. |
| 2023/0284421 A1 | 9/2023 | Malouin et al. |
| 2023/0298969 A1 | 9/2023 | Park et al. |
| 2024/0038633 A1 | 2/2024 | Haba et al. |
| 2024/0203823 A1 | 6/2024 | Uzoh et al. |
| 2024/0222222 A1 | 7/2024 | Haba et al. |
| 2024/0222226 A1 | 7/2024 | Haba |
| 2024/0249995 A1 | 7/2024 | Haba |
| 2024/0266255 A1 | 8/2024 | Haba et al. |

FOREIGN PATENT DOCUMENTS

| | | |
|---|---|---|
| CN | 115719735 A | 2/2023 |
| JP | 2000-340727 A | 12/2000 |
| KR | 10-1049508 B1 | 7/2011 |
| KR | 10-2023-0136509 A | 9/2023 |
| TW | 200834871 A | 8/2008 |
| WO | 2013/097146 A1 | 7/2013 |

OTHER PUBLICATIONS

Francisco Pires, "TSMC Exploring On-Chip, Semiconductor-Integrated Watercooling", tom's Hardware, retrieved from https://www.tomshardware.com/news/tsmc-exploring-on-chip-semiconductor-integrated-watercooling, Jul. 13, 2021, 23 pages.

IBM, "Functional electronic packaging—Thermal management roadmap", available online at <https://web.archive.org/web/20170220095511/https://www.zurich.ibm.com/st/electronicpackaging/cooling.html>, Feb. 20, 2017, 7 pages.

International Search Report and Written Opinion received for PCT Patent Application No. PCT/US23/28942, mailed on Nov. 16, 2023, 12 pages.

International Search Report and Written Opinion received for PCT Patent Application No. PCT/US23/84874, mailed on Apr. 22, 2024, 7 pages.

International Search Report and Written Opinion received for PCT Patent Application No. PCT/US23/85801, mailed on Apr. 26, 2024, 8 pages.

(56) References Cited

OTHER PUBLICATIONS

International Search Report and Written Opinion received for PCT Patent Application No. PCT/US23/85816, mailed on Apr. 23, 2024, 11 pages.
International Search Report and Written Opinion received for PCT Patent Application No. PCT/US23/86233, mailed on Apr. 26, 2024, 7 pages.
Kaplan, F., et al., "LoCool: Fighting Hot Spots Locally for Improving System Energy Efficiency", IEEE Transactions on Computer-Aided Design of Integrated Circuits and Systems, vol. 39, No. 4, Apr. 2020, pp. 895-908.
U.S. Appl. No. 18/129,567, filed Mar. 31, 2023, First Name Inventor: Cyprian Emeka Uzoh, "Embedded Cooling Systems for Device Packages and Methods of Cooling Packaged Devices".
PCT Application No. PCT/US2024/022253, International Search Report and Written Opinion dated Jul. 17, 2024, 14 pages.
Shamsa, M., et al., "Thermal conductivity of diamond-like carbon films", Applied Physics Letters, vol. 89, No. 16, Oct. 20, 2006, pp. 161921-161921-3.
Wu, C. J., et al., "Ultra High Power Cooling Solution for 3D-Ics", 2021 Symposium on VLSI Technology, Jun. 2021, 2 pages.
"KoolMicro Inc. developed the World's First 2,000 W/cm2 Cooling Technology for High Heat Generation Chips," Press Release, 2 pages, downloaded from www.semiconductorpackagingnews.com/uploads/1/KoolMicro_High_Cooling_Power_Density.pdf on Nov. 22, 2023.
"Single-Phase Direct-to-Chip Liquid Cooling," 6 pages, downloaded from https://jetcool.com/post/single-phase-direct-to-chip-liquid-cooling-microconvective-vs-microchannel-liquid-cooled-cold-plates/ on Mar. 7, 2024.
"Microconvective Liquid Cooling for high power electronics," https://jetcool.com/technology/, downloaded Mar. 7, 2024, 6 pages.
Benson D.A. et al., "Micro-Machined Heat Pipes in Silicon MCM Substrates", Sandia National Laboratories, Sandia Report: SAND97-0100-UC-704, printed Jan. 1997, 17 pages.
International Search Report and Written Opinion mailed Jun. 5, 2024, in International Application No. PCT/US2024/013758, 9 pages.
International Search Report and Written Opinion mailed Mar. 16, 2023, in International Application No. PCT/US2022/050105, 9 pages.
International Search Report and Written Opinion mailed May 30, 2023, in International Application No. PCT/US2023/061494, 9 pages.
Johnstone, Caitlin, "Coolant-on-Chip: Say Goodbye to Thermal Interfaces," jetcool, Jun. 9, 2020, https://jetcool.com/post/coolant-on-chip-say-goodbye-to-thermal-interfaces/, downloaded Feb. 29, 2024, 7 pages.
Lien, Y-J, et al., "An Energy-efficient Si-integrated Micro-cooler for High Power and Power-density Computing Applications," 74th Electronic Components and Technology Conference, 2024, pp. 1025-1029.
Walsh, Stephen Michael, "Microjet Impingement Cooling of High Power-Density Electronics," Thesis, submitted May 11, 2018, 93 pages.

* cited by examiner

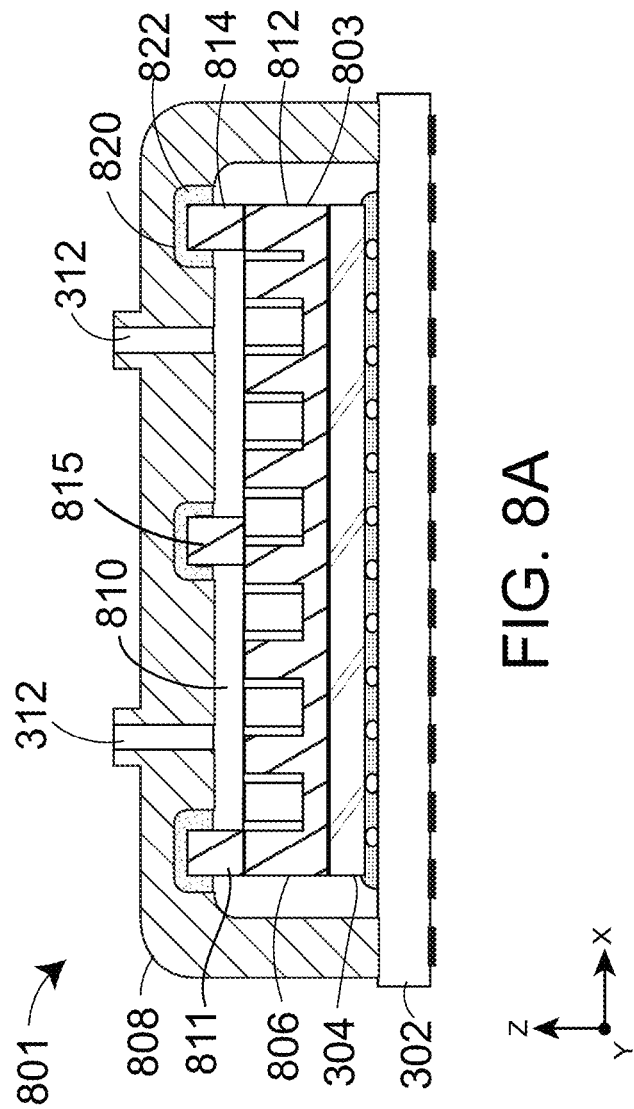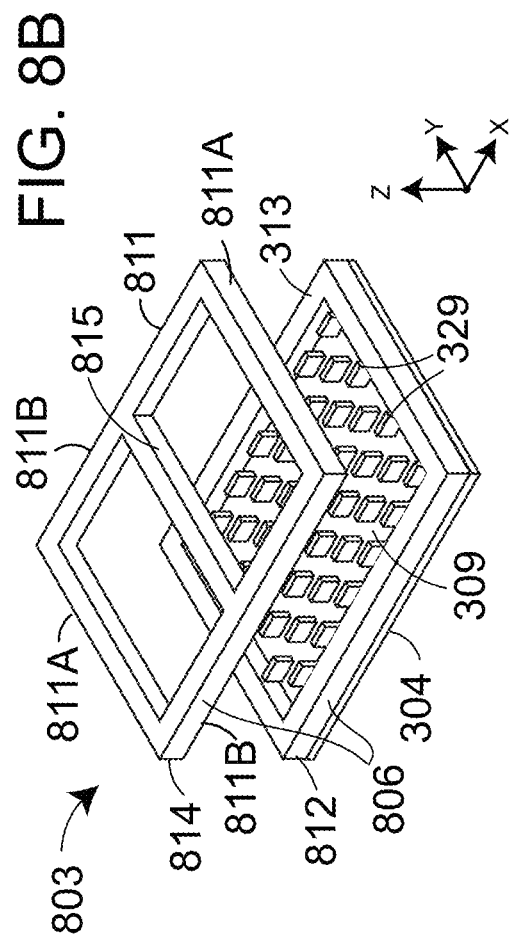

EMBEDDED COOLING SYSTEMS WITH COOLANT CHANNEL FOR DEVICE PACKAGING

CROSS-REFERENCE TO RELATED APPLICATIONS

This application claims priority to U.S. Provisional Application No. 63/435,145, filed on Dec. 23, 2022, which is incorporated herein in its entirety.

FIELD

The present disclosure relates to advanced packaging for microelectronic devices, and in particular, embedded cooling systems for device packages and methods of manufacturing the same.

BACKGROUND

Energy consumption poses a critical challenge for the future of large-scale computing as the world's computing energy requirements are rising at a rate that most would consider unsustainable. Some models predict that the information and communications and technology (ICT) ecosystem could exceed 20% of global electricity use by 2030, with direct electrical consumption by large-scale computing centers accounting for more than one-third of that energy usage. Cooling costs make up a significant portion of computing center energy requirements as even small increases in operating temperatures can negatively impact the performance of microprocessors, memory devices, and other electronic components.

Thermal dissipation in high-power density chips is also a critical challenge as improvements in chip performance, e.g., through increased gate density and multi-core microprocessors, have resulted in increased power density and a corresponding increase in thermal flux that contributes to elevated chip temperatures. These elevated temperatures are undesirable as they can degrade the chip's operating performance, efficiency, and reliability. Cooling systems used to maintain the chip at a desired operating temperature typically remove heat using one or more heat dissipation devices, e.g., thermal spreaders, heat pipes, cold pipes, and heat sinks, which are thermally coupled to the chip using a compliant thermally conductive material (TIM), e.g., thermal pastes, thermal adhesives, thermal gap fillers, etc. The thermal interface material maintains thermal contact with the surfaces of the chip and heat dissipation device(s) to facilitate heat transfer therebetween. Unfortunately, the combined thermal resistance of thermal interface materials and the thermal resistance at interfacial boundary regions inhibits heat transfer from the chip to the heat dissipation devices, undesirably reducing the cooling efficiency of the cooling system.

Accordingly, there exists a need in the art for improved energy-efficient cooling systems and methods of manufacturing the same.

SUMMARY

Embodiments herein provide for integrated cooling assemblies embedded within a device package. The embedded cooling assemblies shorten the thermal resistance path between a device and a heat sink and reduce thermal communication between devices disposed in the same package.

In some implementations, a device package may include a package substrate, a package cover disposed on the package substrate, and an integrated cooling assembly disposed between the package substrate and the package cover. The integrated cooling assembly may include a semiconductor device and a cold plate having a first side attached to the semiconductor device and a second side opposite the first side. An adhesive layer may be disposed between the package cover and the second side of the cold plate, and one or more surfaces of the second side of the cold plate may be spaced apart from the package cover to define a coolant channel therebetween. The adhesive layer may seal the package cover to the cold plate around a perimeter of the coolant channel.

In some implementations, a device package may include an integrated cooling assembly comprising: a cold frame, a first HI device, and a second HI device. The cold plate may include a plurality of sidewalls that surround an opening disposed through a cold plate. The first and second HI device may each include a first die and one or more second dies directly bonded the first die. The first dies may be directly bonded to opposite sides of the cold frame, where the cold frame forms a perimeter of a coolant channel disposed between the first HI device and the second HI device. The backside surfaces of the second dies may face towards one another within the coolant channel.

In some implementations, a method of manufacturing a device package may include directly bonding a first substrate to a second substrate, singulating an integrated cooling assembly from the bonded substrates. The first substrate may include a semiconductor device, the second substrate may include a cold plate, and the integrated cooling assembly includes the cold plate bonded to the semiconductor device. The method may include attaching a package cover to the cold plate, and before or after attaching the package cover, connecting the semiconductor device to a package substrate. The cold plate may include a first side directly bonded to the semiconductor device and a second side opposite the first side, the second side may include one or more surfaces that are spaced apart from the package cover to define a coolant channel therebetween.

BRIEF DESCRIPTION OF THE DRAWINGS

The above and other objects and advantages of the disclosure will be apparent upon consideration of the following detailed description, taken in conjunction with the accompanying drawings, in which:

FIG. 8A is a schematic sectional view of a device package, in accordance with embodiments of the disclosure;

FIG. 8B is a schematic exploded isometric view of the integrated cooling assembly and adhesive layer in FIG. 8A.

Figure 1:
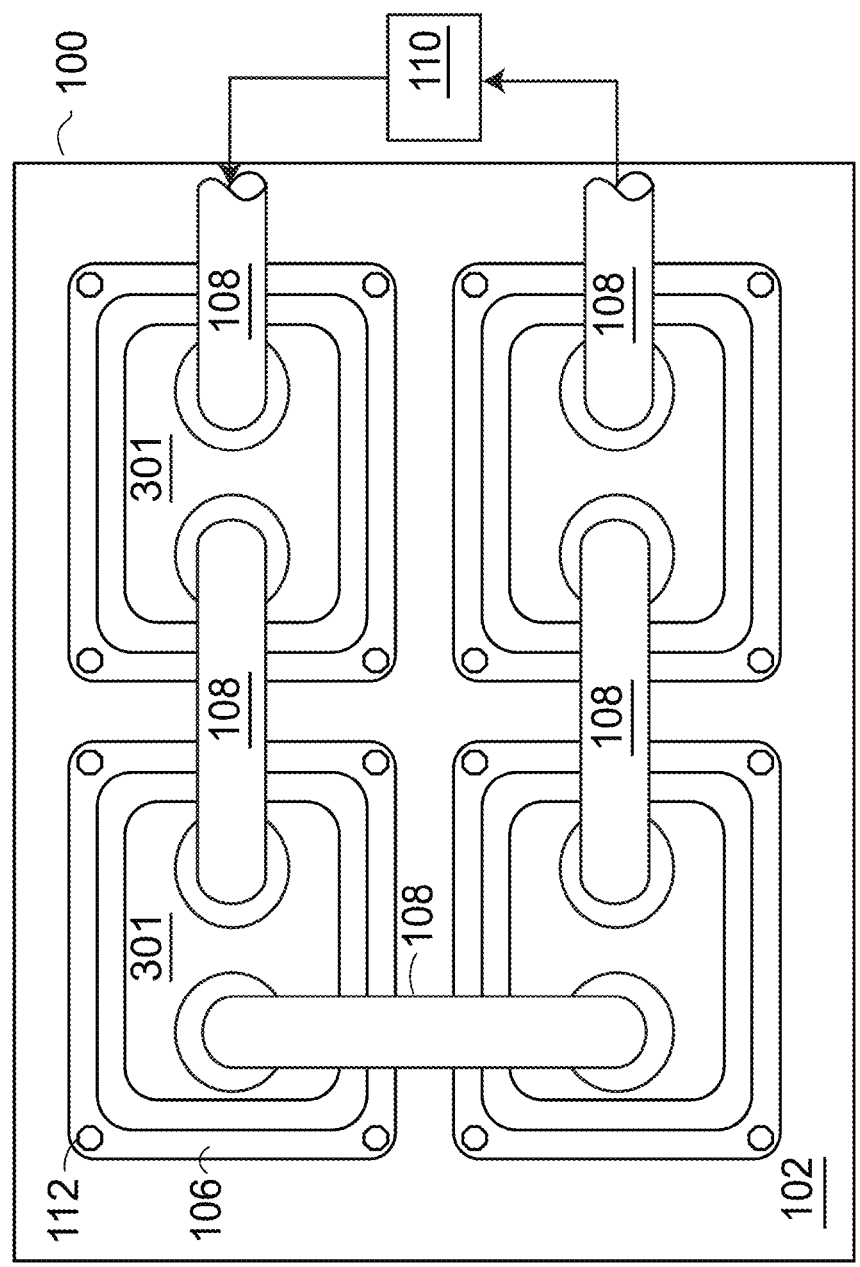
FIG. 1 is a schematic plan view of an example of a system panel, in accordance with embodiments of the disclosure.

The figures herein depict various embodiments of the invention for purposes of illustration only. It will be appreciated that additional or alternative structures, assemblies, systems, and methods may be implemented within the principles set out by the present disclosure.

DETAILED DESCRIPTION

Embodiments herein provide for integrated cooling assemblies embedded within a device package. The embedded cooling assemblies shorten the thermal resistance path between a device and a heat sink and reduce thermal communication between devices disposed in the same package.

As used herein, the term "substrate" means and includes any workpiece, wafer, or article that provides a base material or supporting surface from which or upon which components, elements, devices, assemblies, modules, systems, or features of the heat-generating devices, packaging components, and cooling assembly components described herein may be formed. The term substrate also includes "semiconductor substrates" that provide a supporting material upon which elements of a semiconductor device are fabricated or attached, and any material layers, features, and/or electronic devices formed thereon, therein, or therethrough.

As described below, the semiconductor substrates herein generally have a "device side," e.g., the side on which semiconductor device elements are fabricated, such as transistors, resistors, and capacitors, and a "backside" that is opposite the device side. The term "active side" should be understood to include a surface of the device side of the substrate and may include the device side surface of the semiconductor substrate and/or a surface of any material layer, device element, or feature formed thereon or extending outwardly therefrom, and/or any openings formed therein. Thus, it should be understood that the material(s) that form the active side may change depending on the stage of device fabrication and assembly. Similarly, the term "non-active side" (opposite the active side) includes the non-active side of the substrate at any stage of device fabrication, including the surfaces of any material layer, any feature formed thereon, or extending outwardly therefrom, and/or any openings formed therein. Thus, the terms "active side" or "non-active side" may include the respective surfaces of the semiconductor substrate at the beginning of device fabrication and any surfaces formed during material removal, e.g., after substrate thinning operations. Depending on the stage of device fabrication or assembly, the terms "active" and "non-active sides" are also used to describe surfaces of material layers or features formed on, in, or through the semiconductor substrate, whether or not the material layers or features are ultimately present in the fabricated or assembled device.

Spatially relative terms are used herein to describe the relationships between elements, such as the relationships between substrates, heat-generating devices, cooling assembly components, device packaging components, and other features described below. Unless the relationship is otherwise defined, terms such as "above," "over," "upper," "upwardly," "outwardly," "on," "below," "under," "beneath," "lower," and the like are generally made with reference to the X, Y, and Z directions set forth in the drawings. Thus, it should be understood that the spatially relative terms used herein are intended to encompass different orientations of the substrate and, unless otherwise noted, are not limited by the direction of gravity. Unless the relationship is otherwise defined, terms describing the relationships between elements such as "disposed on," "embedded in," "coupled to," "connected by," "attached to," "bonded to," either alone or in combination with a spatially relevant term include both relationships with intervening elements and direct relationships where there are no intervening elements.

Unless otherwise noted, the term "cold plate" generally refers to a base plate, or a stack of base plates directly bonded to one another, which may be bonded to the semiconductor device. The cold plate may include material layers and/or metal features formed on or in a surface of the base plate or stack of base plates that facilitate direct dielectric or hybrid bonding with the semiconductor device. The direct bonding methods enable heat from the semiconductor device to be transferred through the cold plate to a fluid flowed thereover without the use of a thermal interface material. Unless otherwise noted, the device packages and cold plates described herein may be used with any desired fluid coolant, e.g., liquid, gas, and/or vapor-phase coolants. Thus, the terms should not be construed as limiting the coolant to any one fluid phase.

FIG. 1 is a schematic plan view of an example of a system panel 100, in accordance with embodiments of the disclosure. Generally, the system panel 100 includes a printed circuit board, here PCB 102, a plurality of device packages 301 mounted to the PCB 102, and a plurality of coolant lines 108 fluidly coupling each of the device packages 301 and to a coolant source 110. It is contemplated that coolant may be delivered to each of the device packages 301 in any desired fluid phase, e.g., liquid, vapor, gas, or combinations thereof and may flow out from the device package 301 in the same phase or a different phase. In some embodiments the coolant is delivered to the device package 301 and returned therefrom as a liquid and the coolant source 110 may comprise a heat exchanger or chiller to maintain the coolant at a desired temperature. In other embodiments, the coolant may be delivered to the device packages 301 as a liquid, vaporized to a liquid within the device package, and returned to the coolant source 110 as a vapor. In those embodiments, the device packages 301 may be fluidly coupled to the coolant source 110 in parallel and the coolant source 110 may include or further include a compressor (not shown) for condensing the received vapor to a liquid form.

Figure 2:
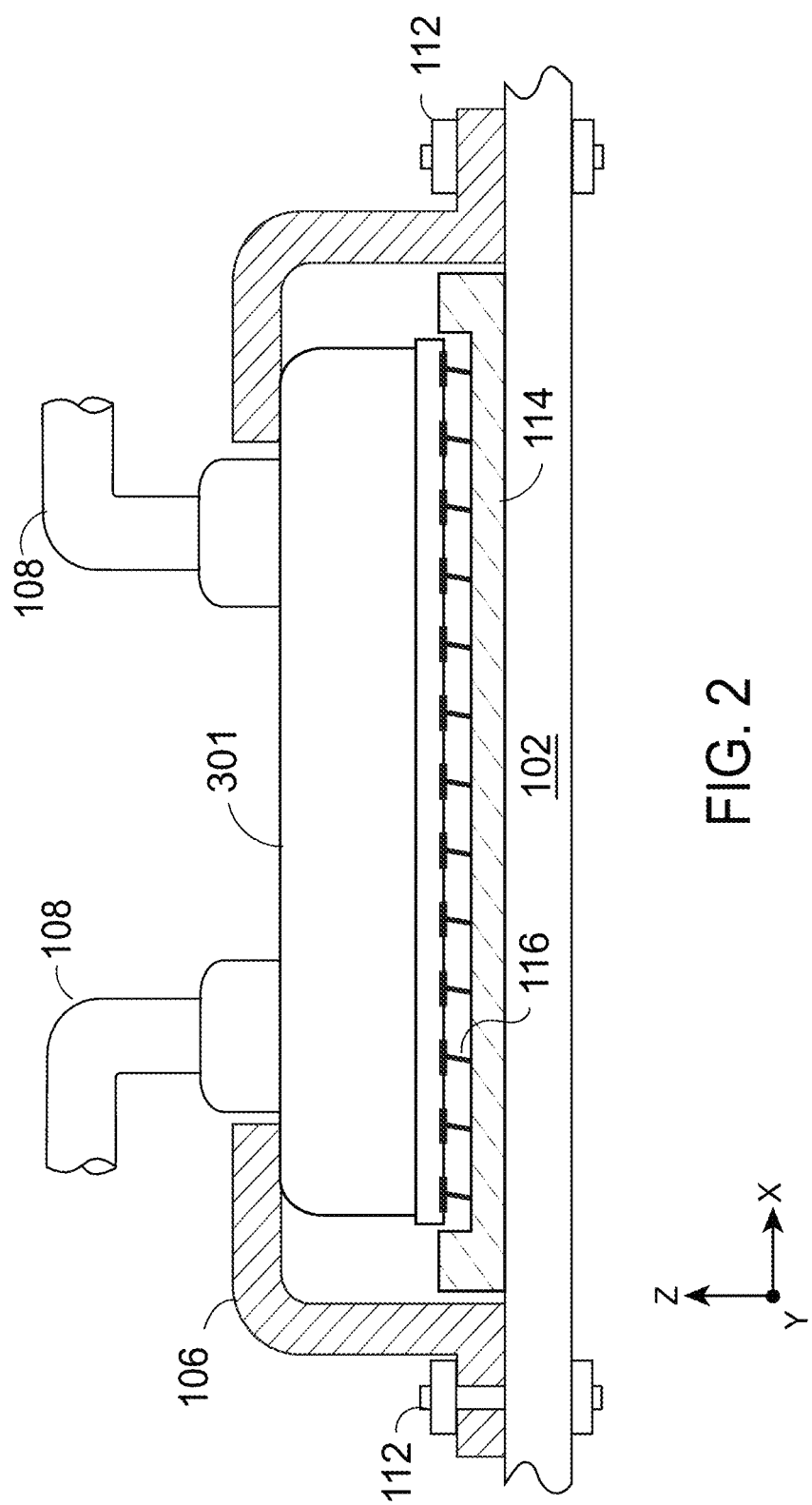
FIG. 2 is a schematic partial sectional side view of a device package mounted on a PCB, in accordance with embodiments of the disclosure.

FIG. 2 is a schematic partial sectional side view of a portion of the system panel 100 of FIG. 1. As shown, each device package 301 is disposed in a socket 114 of the PCB 102 and connected thereto using a plurality of pins 116, or by other suitable connection methods, such as solder bumps (not shown). The device package 301 may be seated in the socket 114 and secured to the PCB 102 using a mounting frame 106 and a plurality of fasteners 112, e.g., compression screws, collectively configured to exert a relatively uniform downward force on the upward facing edges of the device package 301. The uniform downward force ensures proper pin contact between the device package 301 and the socket 114.

As shown, each device package 301 is disposed in a socket 114 of the PCB 102 and connected thereto using a plurality of pins 116, or by other suitable connection methods, such as solder bumps (not shown). The device package 301 may be seated in the socket 114 and secured to the PCB 102 using a mounting frame 106 and a plurality of fasteners 112, e.g., compression screws, collectively configured to exert a relatively uniform downward force on the upward facing edges of the device package 301. The uniform downward force ensures proper pin contact between the device package 301 and the socket 114.

Figure 3A:
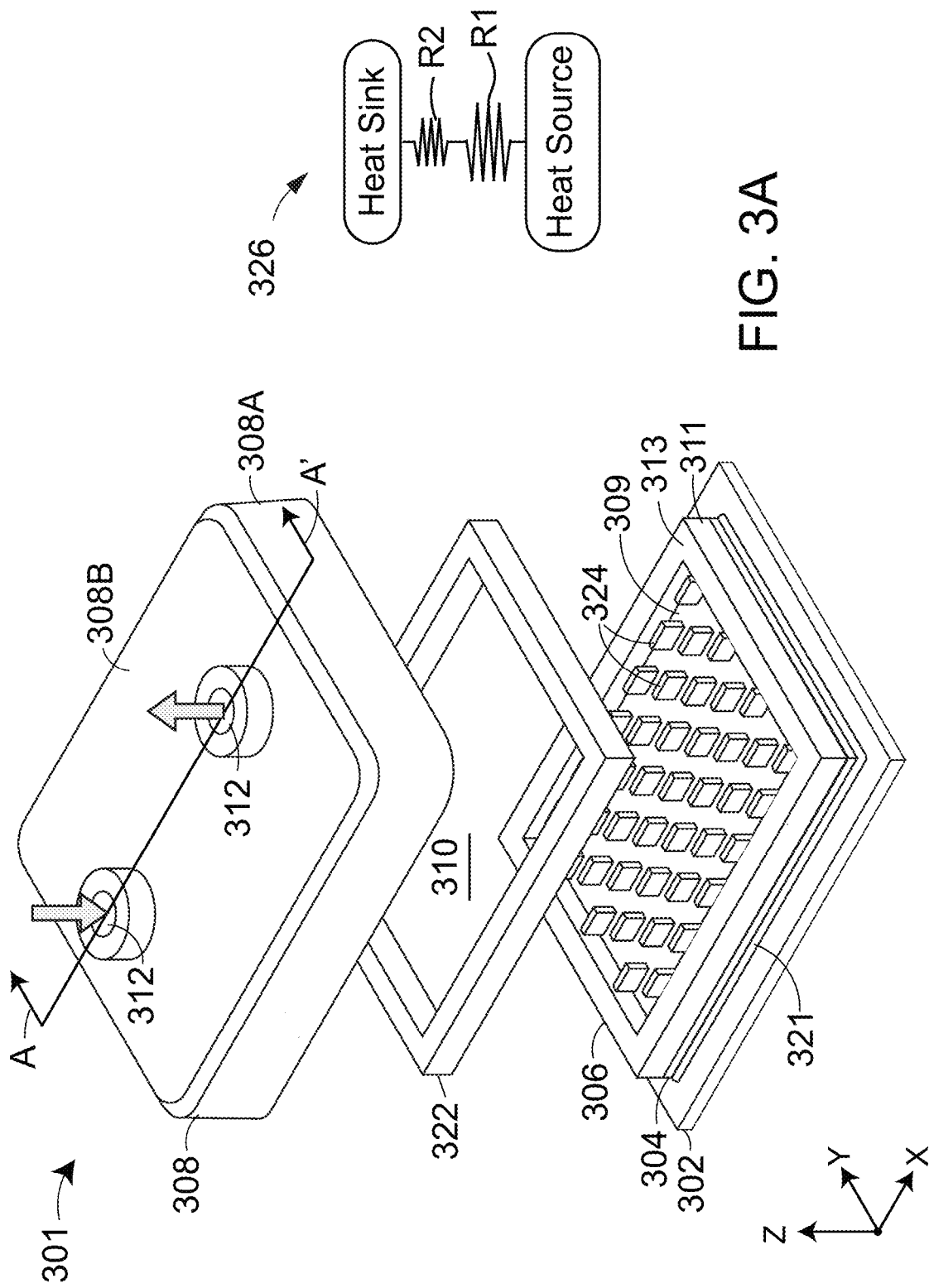
FIG. 3A is a schematic exploded isometric view of the device package in FIG. 2.
Figure 3B:
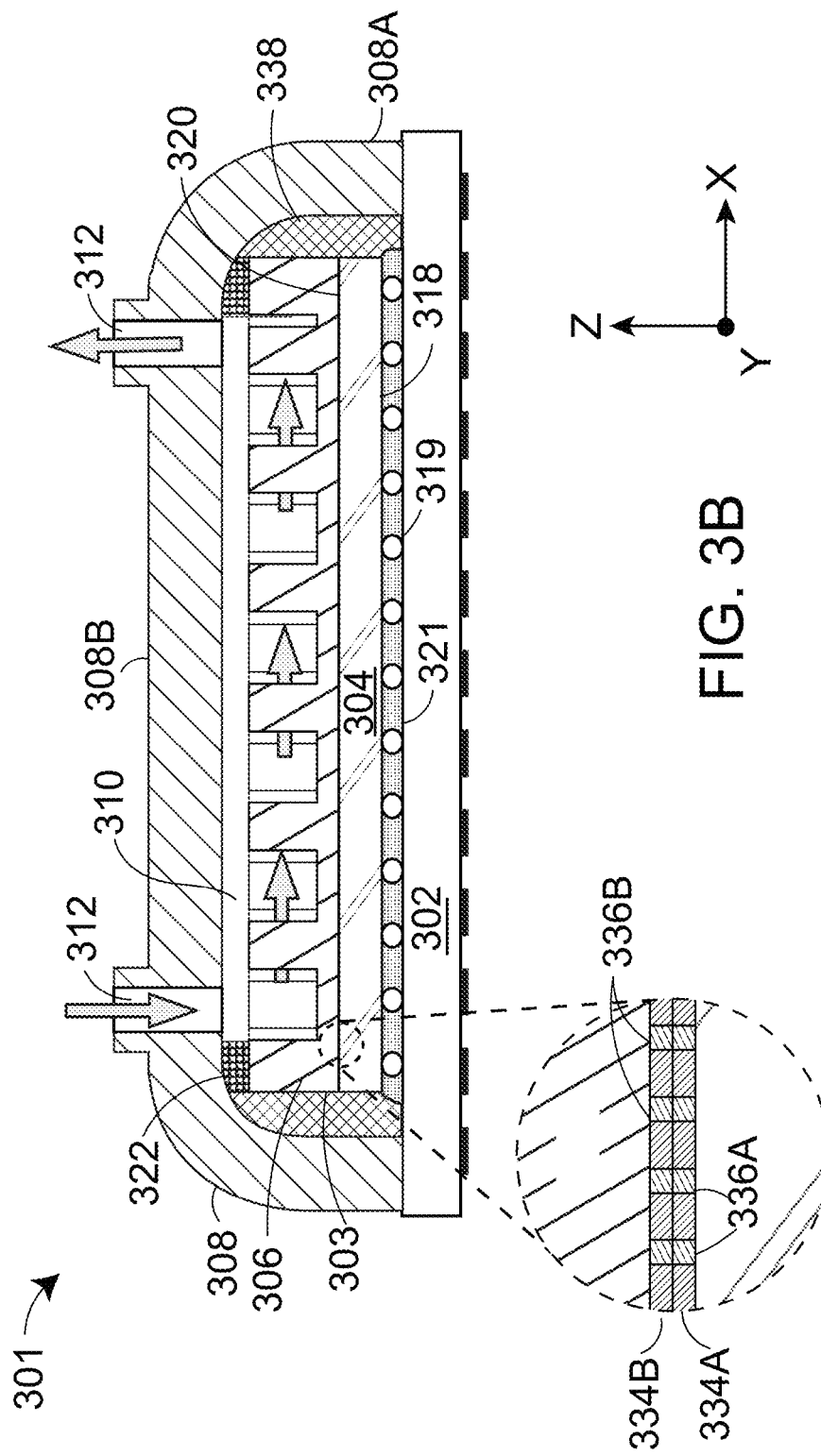
FIG. 3B is a schematic sectional view of the device package of FIG. 3A, taken along line A-A'.

FIG. 3A is a schematic exploded isometric view of the device package 301. FIG. 3B is a schematic sectional view of the device package 301 taken along line A-A'. Generally, the device package 301 includes a package substrate 302, an integrated cooling assembly 303, and a package cover 308. The device package 301 further includes an adhesive layer 322 that attaches the integrated cooling assembly 303 to the package cover 308 to define a coolant channel 310 therebetween.

Typically, the package substrate 302 is formed of a rigid material, such as an epoxy or resin-based laminate, that supports the integrated cooling assembly and the package cover 308. The package substrate 302 typically includes conductive features that electrically couple the integrated cooling assembly 303 to the PCB 102. The integrated cooling assembly 303 may include a semiconductor device, here device 304, disposed on the package substrate 302 and a cold plate 306 bonded to the device 304. Here, the device 304 has an active side 318 that includes device components, e.g., transistors, resistors, and capacitors, formed thereon or therein, and a non-active backside 320 opposite the active side 318. As shown, the active side 318 is positioned adjacent to and facing towards the package substrate 302. The active side 318 may be electrically connected to the package substrate 302 by use of conductive bumps 319, which are encapsulated by an first underfill layer 321 disposed between the device 304 and the package substrate 302. The first underfill layer 321 may comprise a cured polymer resin or epoxy, which provides mechanical support to the conductive bumps 319 and protects against thermal fatigue.

Here, the cold plate 306 is attached to the device backside 320 without the use of an intervening adhesive material, e.g., directly bonded to the device backside 320, such that the cold plate 306 and the device backside 320 are in direct thermal contact. In some embodiments, the cold plate 306 is attached to the device backside 320 using a direct dielectric bonding process. In other embodiments, the cold plate 306 is attached to the device backside 320 using a hybrid of direct dielectric bonds, and direct metal bonds formed therebetween. For example, in some embodiments, one or both of the device backside 320 and the device-facing side of the cold plate 306 comprise a dielectric material layer, e.g., a first dielectric material layer 334A and a second dielectric material layer 334B respectively, and the cold plate 306 is directly bonded to the device backside 320 through bonds formed between the dielectric material layers 334A-B. In some embodiments, the cold plate 306 is directly bonded to the device backside 320 using a hybrid bonding technique, where bonds are formed between the dielectric material layers 334A-B and between metal features, such as between first metal pads 336A and second metal pads 336B, disposed in the dielectric material layers 334A-B.

Suitable dielectrics that may be used as the dielectric material layers 334A-B include silicon oxides, silicon nitrides, silicon oxynitrides, silicon carbon nitrides, metal-oxides, metal-nitrides, silicon carbide, silicon oxycarbides, silicon oxycarbonitride, silicon carbonitride, diamond-like carbon (DLC), or combinations thereof. In some embodiments, one or both of the dielectric material layers 334A-B formed of an inorganic dielectric material, i.e., a dielectric material substantially free of organic polymers. Typically, one or both of the layers 334A-B are deposited to a thickness greater than the thickness of a native oxide, such as about 1 nm or more, 5 nm or more, 10 nm or more, 50 nm or more, 100 nm or more, or 200 nm or more. In some embodiments, the one or both of the layers 334A-B are deposited to a thickness of 301 nm or less, such as 200 nm or less, 100 nm or less, or 50 nm or less.

Beneficially, direct bonding of the dielectric and (optionally) metal surfaces eliminates the need for an intervening adhesive layer or thermal interface material (TIM) layer between the device 304 and the cold plate 306. Thus, the device package 301 provides for a reduced thermal resistance the heat transfer path 326 when compared to the heat transfer path of a conventional device package, e.g., by 50X or more. Methods for forming direct dielectric and hybrid bonds are described below.

As shown, the upwardly facing surfaces of the cold plate 306 form a cavity comprising a base surface 309 that forms a bottom of the coolant channel 310 and sidewalls 311 that surround the base surface 309 and protrude upwardly therefrom. The upward-facing surfaces of the sidewalls 311 form a peripheral surface 313 that supports the adhesive layer 322. Generally, when the device package 301 is assembled, the coolant channel 310 comprises the space between the base surface 309 and the package cover 308. The adhesive layer 322 attaches the peripheral surface 313 to the package cover 308 and forms an impermeable barrier that prevents coolant delivered to the coolant channel 310 from reaching the active side 318 of the device 304 and causing damage thereto. Here, the adhesive layer 322 that absorbs the differences in linear expansion between different materials, thus the adhesive layer 322 may be considered a decoupling adhesive material that allows for differences in CTE's between the package cover 308 and the cold plate 306. In some embodiments, the adhesive layer 322 comprises a decoupling membrane disposed between and adhered to each the cold plate 306 and the package cover 308.

In some embodiments, the cold plate 306 includes a plurality of protruding features 324, such as fins, columns, or pillars that extend upwardly from the base surface 309. The protruding features 324 provide increased surface area and disrupt laminar fluid flow at the interface of the coolant and the cold plate 306 resulting in increased heat transfer therebetween. To further increase heat dissipation from the device, the protruding features 324 may comprise and/or be formed of a thermally conductive metal, such as copper. Typically, the protruding features 324 are arranged in a repeating pattern. In some embodiments, the protruding features 324 may be arranged in a randomized pattern.

In some embodiments, the cold plate 306 is formed of a material having a coefficient of thermal expansion (CTE) substantially similar to the CTE of the bulk semiconductor substrate of device 304. For example, in some embodiments, the device 304 may be formed on a monocrystalline silicon substrate, and the cold plate 306 may be formed from a monocrystalline silicon or polycrystalline silicon substrate. Forming the cold plate 306 from CTE matched materials (with respect to the bulk substrate material of the device 304) prevents undesired separation of the device 304 and cold plate 306 across repeated thermal cycles.

In some embodiments, the cold plate 306 may be formed from non-crystalline silicon materials, such as a bulk substrate material comprising metal, metal alloys, ceramics, composite materials or other low CTE materials suitable for the bonding using the methods described below. For example, the cold plate 306 may be formed from a bulk material selected from the group comprising copper, aluminum, copper alloys (e.g., copper molybdenum alloys and copper tungsten alloys), iron-cobalt nickel alloys (e.g., Kovar® from Magellan Industrial Trading Co., Inc. of South Norwalk Connecticut USA), iron-cobalt nickel silver alloys, iron-nickel alloys (e.g., Invar® superalloys from Magellan), iron-nickel silicon alloys, aluminum silicon carbides, aluminum-silicon alloys, beryllium, beryllium oxides, beryllium, and beryllium oxide composites, aluminum-graphite fibers, copper-graphite fibers, metal diamond composite materials (e.g., aluminum diamond composites and silver-diamond composites), metal oxides, metal nitrides, and combinations thereof. The non-silicon substrate materials may be prepared for bonding as described below and may or may not include a dielectric material layer deposited on the device facing side to form a bonding surface.

The package cover 308 generally comprises one or more vertical or sloped sidewall portions 308A and a lateral portion 308B that spans and connects the sidewall portions 308A. The sidewall portions 308A extend upwardly from a peripheral surface of the package substrate 302 to surround the device 304 and the cold plate 306 disposed thereon. The lateral portion 308B is disposed over the cold plate 306 and is typically spaced apart from the cold plate 306 by a gap corresponding to the thickness of the adhesive layer 322. Coolant is circulated through the coolant channel 310 through the inlet/outlet openings 312 formed through the lateral portion 308B. Cooling lines may be attached to the device package 301 by use of threads formed in the sidewalls of the inlet/outlet openings 312 and/or connector features that surround the openings 312 and extend upwardly from a surface of the lateral portion 308B.

Typically, the package cover 308 is formed of semi-rigid or rigid material so that at least a portion of the downward force exerted on the package cover 308 by the mounting frame 106 (FIG. 2) is transferred to the supporting surface of the package substrate 302 and not transferred to the cold plate 306 and the device 304 therebelow. In some embodiments, the package cover 308 is formed of a thermally conductive metal, such as aluminum or copper. In some embodiments, the package cover 308 functions as a heat spreader that redistributes heat from one or more electronic components within a multi-component device package, such as described below.

As noted above, the adhesive layer 322 thermally couples the cold plate 306 to the package cover 308 and defines a coolant channel 310 in combination therewith. As shown, the adhesive layer 322 is disposed between the peripheral surface 313 of the cold plate 306 the lateral portion 308B of the package cover 308. Here, the cold plate 306 forms the lower or base surfaces of the coolant channel 310 and at least a portion of the coolant channel sidewalls, the package cover 308 forms the upper surfaces of the coolant channel 310, and the adhesive layer 322 forms a seal between the package cover 308 and the peripheral surface 313 of the cold plate 306. In other embodiments, the adhesive layer 322 may be disposed between the sidewalls 311 of the cold plate 306 and the sidewall portions 308A of the package cover 308. Generally, when the device package 301 is assembled, the adhesive layer 322 forms an impermeable barrier that prevents coolant delivered to the coolant channel 310 from reaching the active side 318 of the device 304 and causing damage thereto.

In some embodiments, the device package 301 further includes a second underfill layer 338 (shown in FIG. 3B) disposed in gaps regions outside of the coolant channel 310, such as between the package cover 308, the adhesive layer 322, and the package substrate 302. For example, the second underfill layer 338 may include a polymer or epoxy material that extends upwardly from the package substrate 302 to encapsulate and/or surround the device 304 and, in some embodiments, at least portion of the cold plate 306. When used, the second underfill layer 338 may provide mechanical support that improves system reliability and extends the useful lifetime of the device package 301. For example, the second underfill layer 338 may reduce mechanical stresses that can weaken interfacial bonds and/or electrical connections between the components of the device package 301, such as stresses caused by vibrations, mechanical and thermal shocks, and/or fatigue caused by repeated thermal cycles. In some embodiments, the second underfill layer 338 may be a thermally conductive material, such as a polymer or epoxy having one or more thermally conductive additives, such as silver and/or graphite.

Figure 4C:
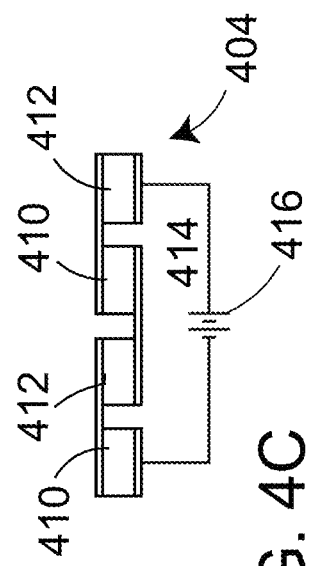
FIG. 4C is a schematic side-view of a thermoelectric cooling device, in accordance with embodiments of the disclosure.
Figure 4A:
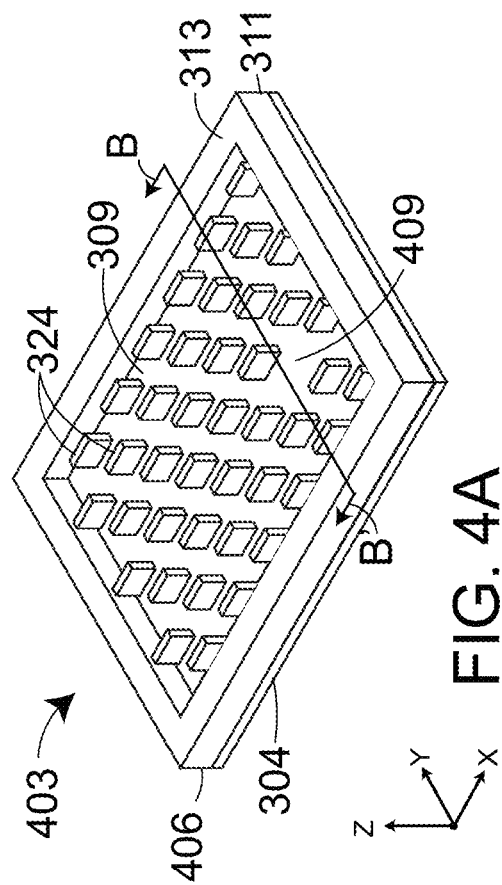
FIG. 4A is a schematic isometric view of an integrated cooling assembly, in accordance with embodiments of the disclosure.
Figure 4B:
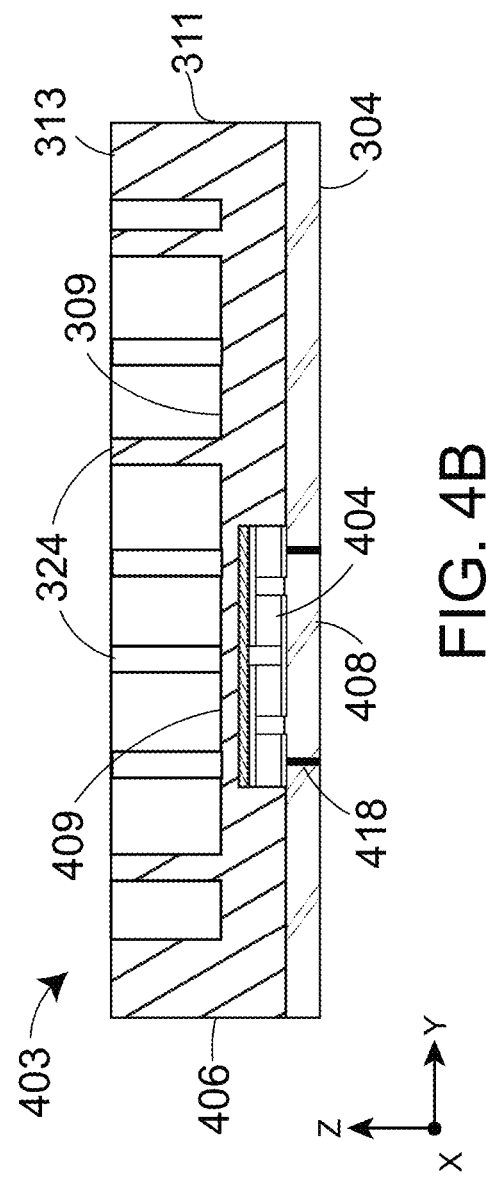
FIG. 4B is a schematic sectional view of the integrated cooling assembly in FIG. 4A, taken along line B-B'.

FIG. 4A is a schematic isometric view of an integrated cooling assembly 403 that provides increased thermal dissipation from a high heat flux region, i.e., a hotspot region 408 relative to the thermal dissipation from adjacent regions of the device 304. FIG. 4B is a schematic side sectional view of the integrated cooling assembly 403 (taken along line B-B' of FIG. 4A) that shows an embedded thermoelectric cooler, here a TEC 404, disposed over the device hotspot 408. FIG. 4C is a close up view of the TEC 404. Typically, the integrated cooling assembly 403 includes one or more TECs 404, each disposed in a corresponding cavity formed in the cold plate 406. Generally, each TEC 404 includes alternating n-type semiconductor pillars 410 and p-type semiconductor pillars 412 that are electrically connected in a series by a plurality of conductive plates 414. Each TEC 404 is coupled to a DC power supply 416 and as current flows therethrough heat is moved from a first side of the TEC 404 disposed adjacent to the hotspot region 408 to a second side of the TEC 404 adjacent to the cold plate 406. Each TEC 404 may be secured to one or both of the device 304 and the cold plate 406 using a direct bonding method described below.

Here, power is delivered to the TEC 404 using metal interconnects and/or vias formed in, on, or through the device 304, such as the through-substrate vias (TSVs) 418 shown. In some embodiments, power may be delivered to the TECs 404 using conductive features formed in or between the interfacing surfaces of the device 304 and the cold plate 406. In some embodiments, power may be delivered to the TECs 404 through conductive features, e.g., metal interconnects and vias formed in and/or through the cold plate 406.

In some embodiments, the number of protruding features (count), density, size, and/or shape of the protruding features 324 extending upwardly from the base surface 309 in regions disposed above a TECs 404 is different from the surrounding regions of the base surface 309. For example, as shown in FIGS. 4A-4B, the surface region 409 disposed above the TEC 404 has fewer or no protrusions when compared to adjacent regions of the base surface 309, which provides for increase volumetric flowrates of coolant over the region 409, resulting in turn, in increased relative heat transfer therefrom.

Figure 5:
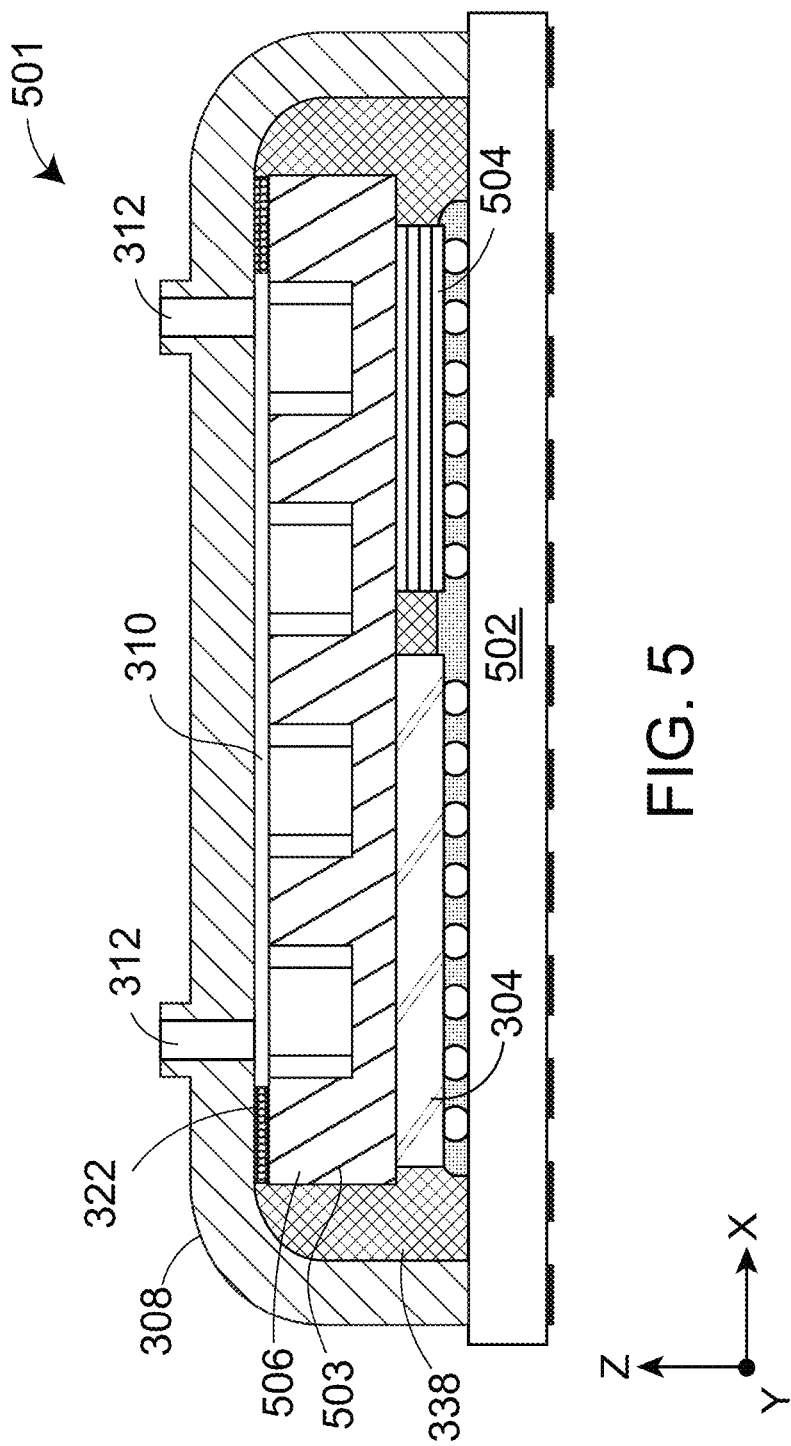
FIG. 5 is a schematic sectional view of a device package, in accordance with embodiments of the disclosure.

FIG. 5 is a schematic side sectional view of an example of a multi-component device package 501 that includes a cold plate 506 directly bonded to the backside surfaces of two or more devices. As shown, the device package 501 includes a package substrate 502, e.g., an interposer that facilitates communication between the device 304 and the device stack 604, an integrated cooling assembly 503, a package cover 308, and an adhesive layer 322. The integrated cooling assembly 503 may include a plurality of devices which may be singulated, e.g., device 304 and/or disposed in a vertical device stack 504, and a cold plate 306 bonded to each of the devices 304 and device stacks 504. In some embodiments the device 304 may comprise a processor and the device stack 504 may comprise a plurality of memory devices. As shown, the device 304 and the device stack 504 are disposed in a side-by-side arrangement on the package substrate 302 and are electrically connected thereto using a suitable method. The cold plate 506 is disposed over and is directly bonded to the backside of the device 304 and a backside of the uppermost device of the stack 504. Here, the cold plate 506 is sized to provide a bonding surface for attachment to both the device 304 and the device stack 504 but may otherwise be the same or substantially similar to other cold plates described herein. For example, the cold plate 506 may include any one or combination of the features of the cold plates described in relation to the other figures herein. In some embodiments, the integrated cooling assembly 503 may include one or more TECs 404 (FIG. 4B) embedded between the cold plate 506 and the first device 904A and/or between the cold plate 506 and the device stack 504.

Figure 6:
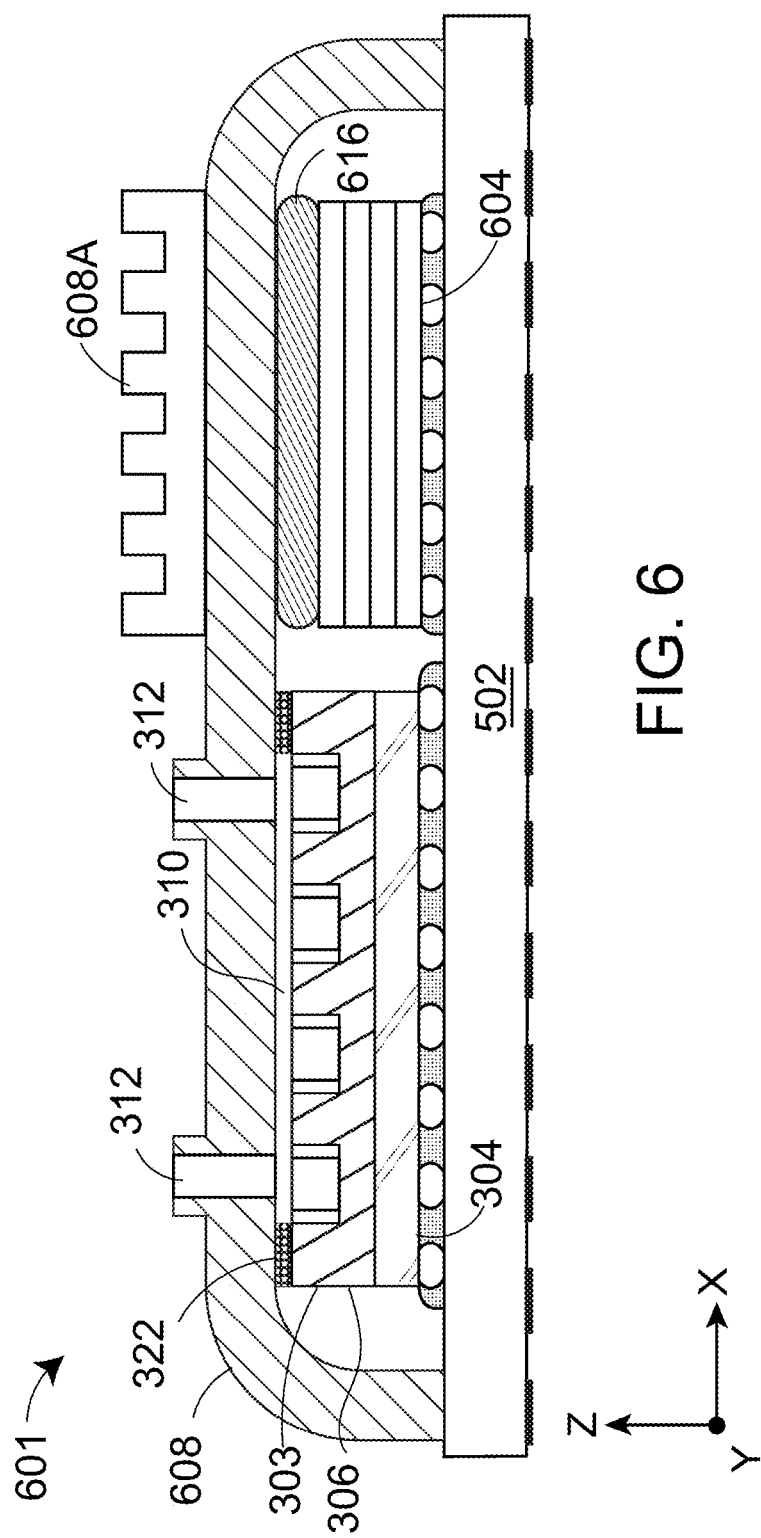
FIG. 6 is a schematic sectional view of a device package, in accordance with embodiments of the disclosure.

FIG. 6 is a schematic side sectional view of an example of a multi-component device package 601 that includes the integrated cooling assembly 303 and a device stack 604, where heat is transferred from the device stack 604 to the integrated cooling assembly 303 via the package cover 608. Here, the device package 601 includes a package substrate 502, the integrated cooling assembly 303, one or more second devices (shown here as the device stack 604), and the package cover 608. Typically, the integrated cooling assembly 303 is coupled to the package cover 608 by use of an adhesive layer 322 to define a coolant channel 310 disposed therebetween. The device stack 604 may be disposed on the package substrate 502 in a side-by-side arrangement with the device 304. As described above, heat generated by the device 304 is dissipated to a coolant that is circulated through a coolant channel, here coolant channel 310 via inlet/outlet openings 312 formed through the package cover 608. The package cover 608 may be formed of a thermally conductive material and function as a thermal spreader. Heat generated by the device stack 604 is dissipated to the coolant via the package cover 608 which is thermally coupled to the device stack 604 by use of a TIM layer 616. Beneficially, the cold plate 306 blocks a thermal pathway between the device 304 and the device stack 604 to prevent heat from transferring therebetween. Thus, the device package 601 may be advantageously used to facilitate closely spaced devices on an interposer, such as high-power devices and memory stacks, to provide for reduced latency while simultaneously eliminating undesirable heat transfer therebetween.

In some embodiments, the device package 601 further includes a heat sink 608A disposed on a portion of the package cover 601 above the device stack 604. The heat sink 608A may be thermally coupled to the package cover 608 by use of a TIM layer (not shown) or by direct bonding using the methods described herein. In some embodiments, the device package 601 includes one or more TECs 404 and/or a second underfill layer 338, as shown above.

Figure 7A:
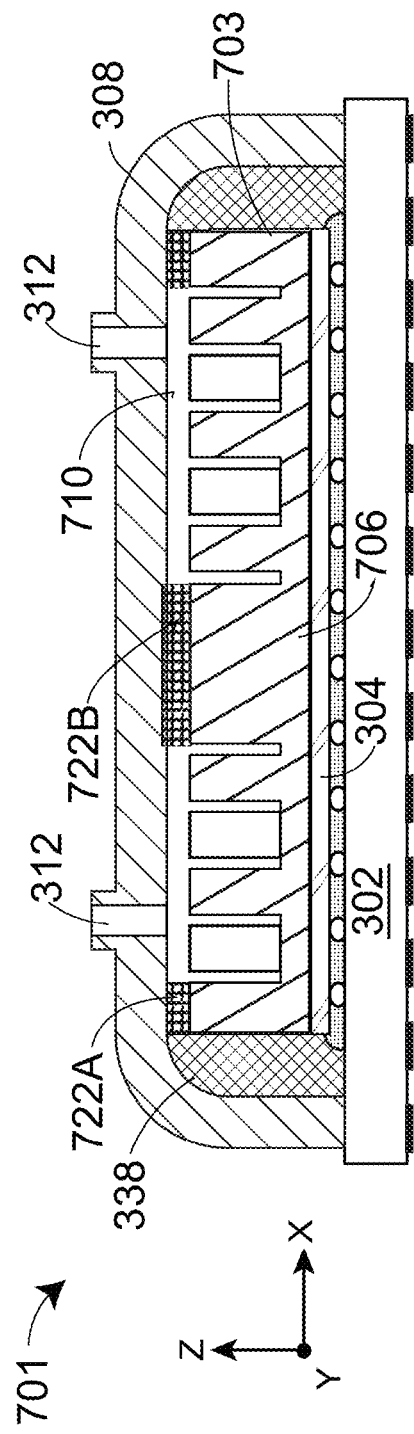
FIG. 7A is a schematic sectional view of a device package, in accordance with embodiments of the disclosure.
Figure 7B:
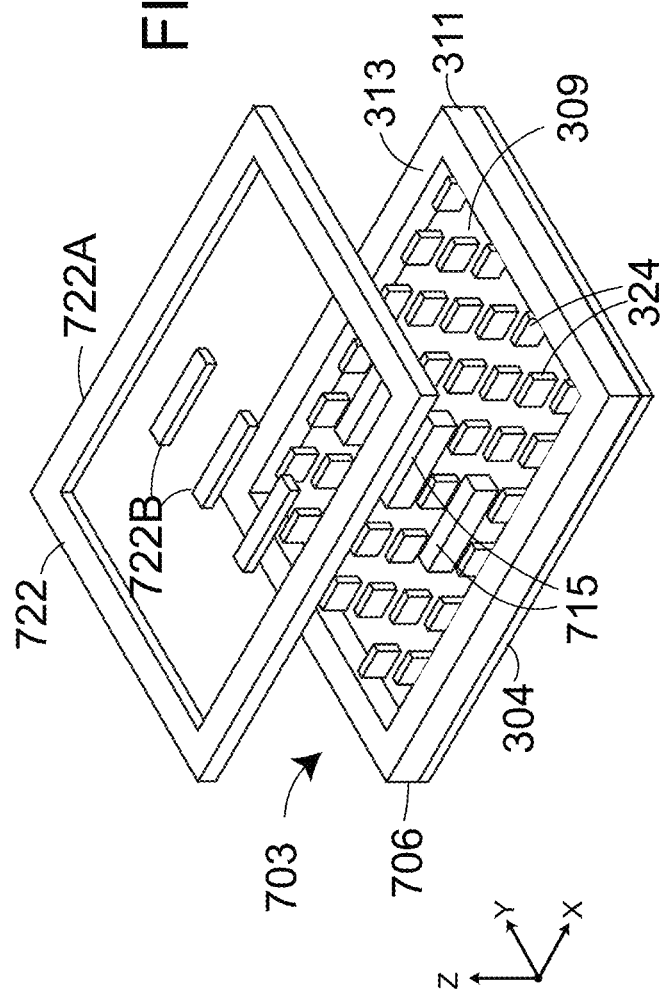
FIG. 7B is a schematic exploded isometric view of the integrated cooling assembly and adhesive layer in FIG. 7A.

FIG. 7A is a schematic side section view of a device package 701 with additional adhesive between the package cover 308 and inner surfaces 715 of the cold plate 706. FIG. 7B is a schematic isometric exploded view of the integrated cooling assembly 703 and the adhesive layer 322. Generally, the device package 701 includes a package substrate 302, an integrated cooling assembly 703, and a package cover 308. The integrated cooling assembly 703 includes a device 304 and a cold plate 706 directly bonded to the device 304 by use of the adhesive layer 722 which includes a first portion 722A disposed on the peripheral surface 313 and a second portion 722B disposed on inner surfaces 715 (surfaces of the cold plate 706 disposed inwardly from the peripheral surface 313). Here, the first portion 722A forms a hermetic seal between the cold plate 706 and the package cover 308 to define a perimeter of a coolant channel 710 disposed between the cold plate 706 and the package cover 308. The second portion 722B attaches the inner surfaces 715 to the corresponding portions of the package cover 308 disposed thereover. The inner surfaces 715 may be disposed on protrusions extending upwardly from the base surface 309 (as shown) or may comprise regions of the base surface 309. The additional attachment locations provided by the second portion 722B substantially reduce or prevent distortion of the package cover 308 due to the high pressure coolant circulated through the coolant channel 710. Thus, the additional attachment locations allow for increased coolant flowrates that in turn provide for increased cooling efficiency. It is contemplated that the additional attachment locations provided by the second portion 722B of can be used with any of the device packages described herein.

FIG. 8A is a schematic side section view of a device package 801 where portions of an integrated cooling assembly 803 protrude into a lower surface of a package cover 808 to provide added structural support. FIG. 8B is a schematic isometric exploded view of the integrated cooling assembly 803. As shown, the integrated cooling assembly 803 includes a device 304 and a cold plate 806 directly bonded to the device 304. The cold plate 806 includes a plurality of plates patterned and directly bonded to one another, shown here as a first plate 812 and a second plate 814 directly bonded to the first plate 812. The first plate 812 may be substantially similar to, or comprise any combination of features of, the cold plates 306, 406, 506 described above. Here, the first plate 812 includes the base surface 309, the protruding features 329, the sidewalls 311, and the peripheral surface 313 described above in relation to the cold plate 306. The second plate 814 includes a plurality of sidewalls 811 aligned with and bonded to the sidewalls 311 of the first plate 812. A blind opening formed in an inner surface of the package cover 808 and/or protrusions extending downwardly form the inner surface form a well-region that is sized and shaped to receive the upper portions of the sidewalls 811. In some embodiments, the sidewalls 811 form a rectangular annulus (when viewed form the z-direction) and the well-region 820 has a corresponding rectangular annulus shape.

Here, the integrated cooling assembly 803 may be attached to the package cover 808 by an adhesive layer 822 disposed in the well-region 820. The adhesive layer 822 surrounds an upper portion of the sidewalls 811 to form a hermetic seal between the cold plate 806 and the package cover 808 and define the perimeter of the coolant channel 810. In some embodiments, the adhesive layer 822 is formed of a compliant material that, when compressed between the package cover 808 and the cold plate 806 forms an impermeable seal around a perimeter of the coolant channel 810.

In some embodiments, the second plate 814 includes one or more inner supports 815 (one shown) that connect opposing sidewalls 811A, and are spaced apart from each of the sidewalls 811B. In those embodiments, a portion of the well-region 820 may be sized and shaped to receive upper portions of the inner supports 815. When used, the inner supports 815 provide structural support to the second plate 814 and further secure the package cover 808 to the integrated cooling assembly 803. The additional attachment points provided by the inner supports 815 substantially reduces or prevents distortion of the package cover 808 due to high pressure coolant circulated through the coolant channel 810. Thus, the additional attachment points allow for increased coolant flowrates which provide for corresponding increased cooling efficiency. It is contemplated that the features of device package, such as the cold plate 806 and the package cover 808 described above, can be advantageously used in combination with the features of any other of the device packages described herein.

Figure 9:
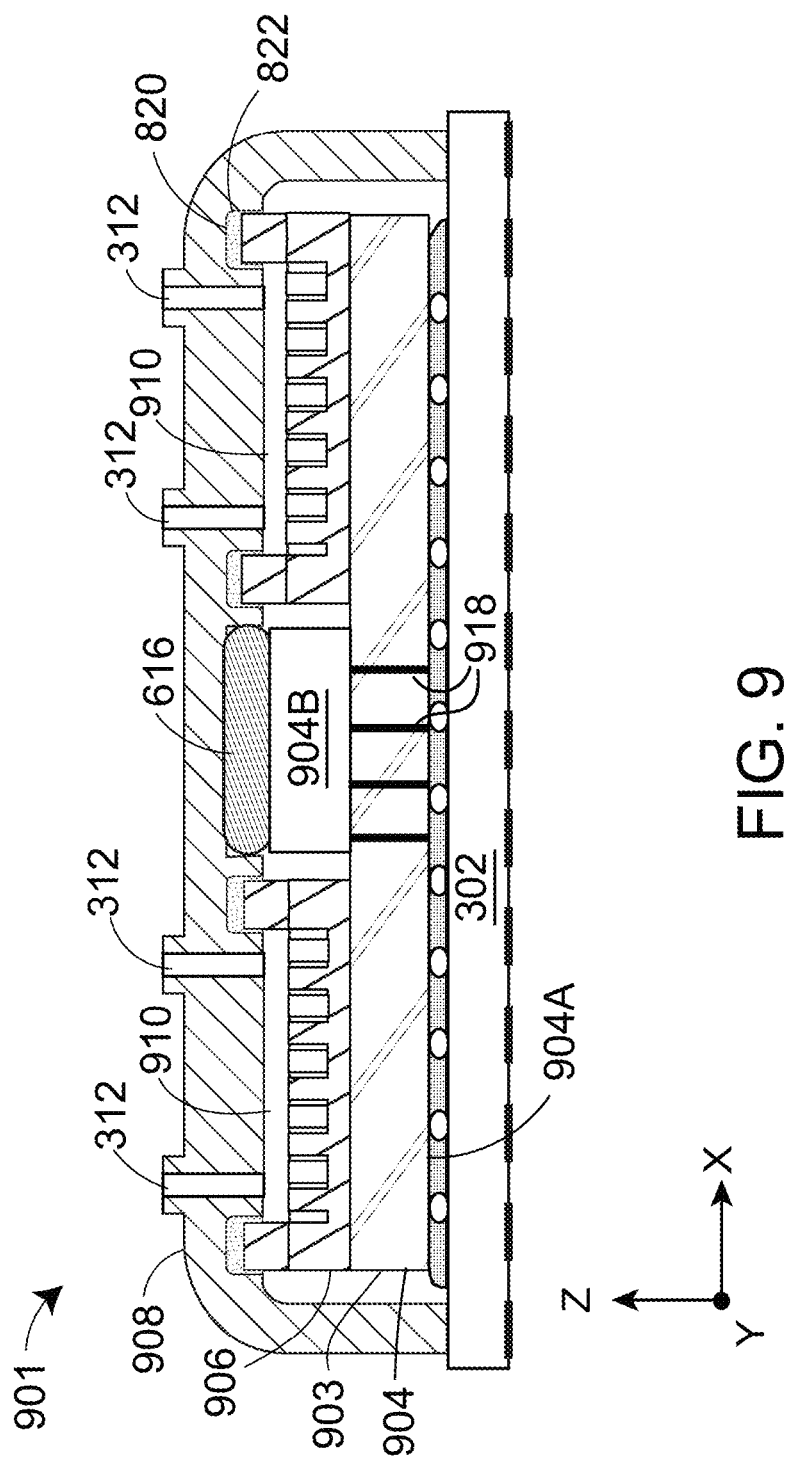
FIG. 9 is a schematic sectional view of a device package, in accordance with embodiments of the disclosure.

FIG. 9 is a schematic side section view of a device package 901 with one or more cold plates 906 positioned to cool portions of a 3DIC device 904. Generally, the device package 901 includes an integrated cooling assembly 903 disposed on and electrically connected to the package substrate 302, and a package cover 908 disposed over the integrated cooling assembly 903. The integrated cooling assembly 903 includes the 3DIC device 904, which includes a first device 904A and one or more second devices 904B (one shown), and the one or more cold plates 906. Here, the first device 904A is disposed facing towards the package substrate 302, i.e., active-side down, and the second device 904B is disposed on and bonded to a portion of a backside of the first device 904A. The first device 904A comprises a plurality of interconnects formed between the active side and the backside, e.g., through-substrate vias (TSVs 918). In those embodiments, the first device 904A and the second device 904B may be interconnected using the TSVs 918 and hybrid bonds formed between the active side of the second device 904B and the backside of the first device 904A. In some embodiments, the one or more second devices or device stacks 604 are directly bonded to, and interconnected with, the first device 904A using direct hybrid bonds.

Here, the first device 904A is cooled using the one or more cold plates 906 (two shown) which are disposed on and bonded to the backside of the first device 904A in a side-by-side arrangement with the second device 904B. Each of the one or more cold plates 906 are attached to the package cover 908 using an adhesive layer 822, where the adhesive material forms a hermetic seal between a peripheral surface of the cold plate 906 and the package cover 908, respectively, to at least partially define a coolant channel therebetween. Heat generated by the first device 904A is dissipated from the device package via coolant flowing through the coolant channels 910 disposed thereover. In some embodiments, the second device 904B is thermally coupled to the package cover 908 by use of a TIM layer 616. In those embodiments, the package cover 908 may function as a heat spreader so that heat generated by the second device 904B is transferred to the coolant in the coolant channels 910 via a heat transfer path that includes the TIM layer 616 and the package cover 908.

Figure 10A:
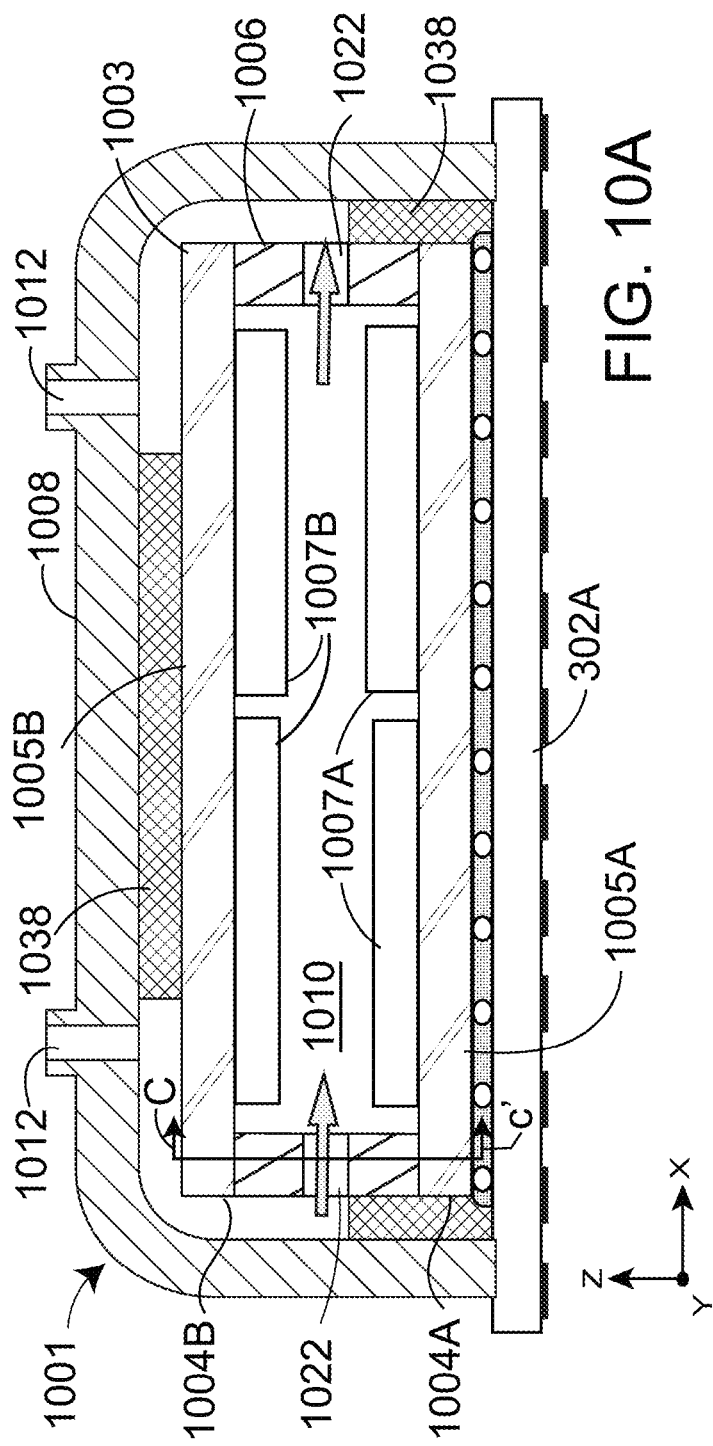
FIG. 10A is a schematic sectional view of a device package, in accordance with embodiments of the disclosure.
Figure 10B:
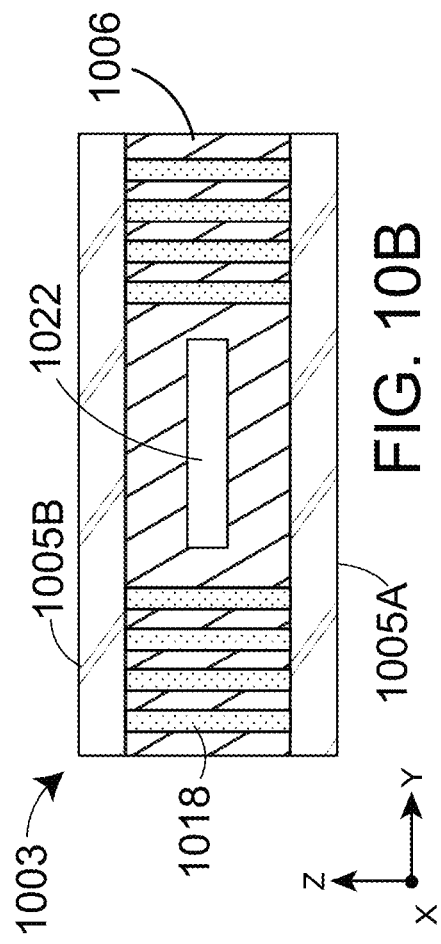
FIG. 10B is a schematic sectional view of the integrated cooling assembly in FIG. 10A, taken along line C-C'.

FIG. 10A is a schematic side sectional view of device package 1001 with a coolant channel 1010 disposed between a first HI device 1004A and a second HI device 1004B of an integrated cooling assembly 1003. FIG. 10B is a schematic sectional view of the integrated cooling assembly 1003 taken along line C-C' of FIG. 10A. Here, the device package 1001A includes a package substrate 302, the integrated cooling assembly 1003 disposed on the package substrate 302, and (optionally) a package cover 1008 disposed over the integrated cooling assembly 1003. The integrated cooling assembly 1003 forms a fluid chamber that includes a first heterogenous integration (HI) device 1004A, a second HI device 1004B, and a frame shaped cold plate, here a cold frame 1006 disposed between the first HI device 1004A and the second HI device 1004B.

Generally, the first HI device 1004A and/or the second HI device 1004B comprises a plurality of dissimilar integrated circuits that have been connected to one another via hybrid bonding to form the heterogeneous integration. For example, the first HI device 1004A may include an interposer 1005A and a plurality of semiconductor devices 1007A (and/or device stacks) disposed in a side-by-side arrangement on the interposer 1005A. Here, the semiconductor devices 1007A are interconnected through the interposer 1005A using hybrid bonds formed therebetween. The second device 1004B is a 3DIC integration that includes a base die 1005B and one or more second devices 1007B, e.g., chiplets, bonded to the base die 1005B, e.g., by hybrid bonds. In other embodiments, both devices are a 2.5DIC or a 3DIC integration or the relative positions of the first HI device 1004A and the second HI device 1004B may be exchanged. In some embodiments, the interposer 1005A and/or base die 1005B comprise a plurality of conductive features (not shown), e.g., bond pads, formed in the peripheral surfaces thereof.

The cold frame 1006 generally comprises a plurality of sidewalls that form a polygonal annulus shape, e.g., a rectangular annulus shape, when viewed from the Z-direction. In some embodiments, the cold frame 1006 may further include a plurality of vias 1018 (FIG. 10B) disposed in the sidewalls and extending between opposite surfaces of the plate (in the Z-direction). The cold frame 1006 is aligned with and bonded to the peripheral surfaces of the interposer and/or die 1005A-B, by use of hybrid bonding. As shown, the devices 1004A-B and cold frame 1006 bonded therebetween collectively define a coolant channel 1010, where the backside surfaces of the devices 1007A-B are disposed in the coolant channel 1010. Coolant fluid is circulated through the coolant channel 1010 via inlet/outlet openings 1022 formed through opposing sidewalls of the cold frame 1006. In some embodiments, the device package 1001A may include a package cover 1008 disposed over the integrated cooling assembly 1003 and an adhesive or molding material 1038 disposed between the package cover 1008 and the integrated cooling assembly. In those embodiments, the coolant fluid may be delivered to the channel 1010 via a flow pathway that includes inlet/outlet openings 1012, openings in the molding material 1038, and the openings 1022 formed through the plate sidewalls, each of which is in registration or fluid communication with one another.

In the device package 1001A, the integrated cooling assembly 1003 is disposed on and electrically connected to the package substrate 302, e.g., by conductive bumps 319 disposed between the package substrate and the interposer 1005A. The second device 1004B is in electrical communication with the package substrate through the vias 1018 and the hybrid bonds formed between the interposer 1005A, the cold frame 1006, and the base die 1005B.

Figure 10C:
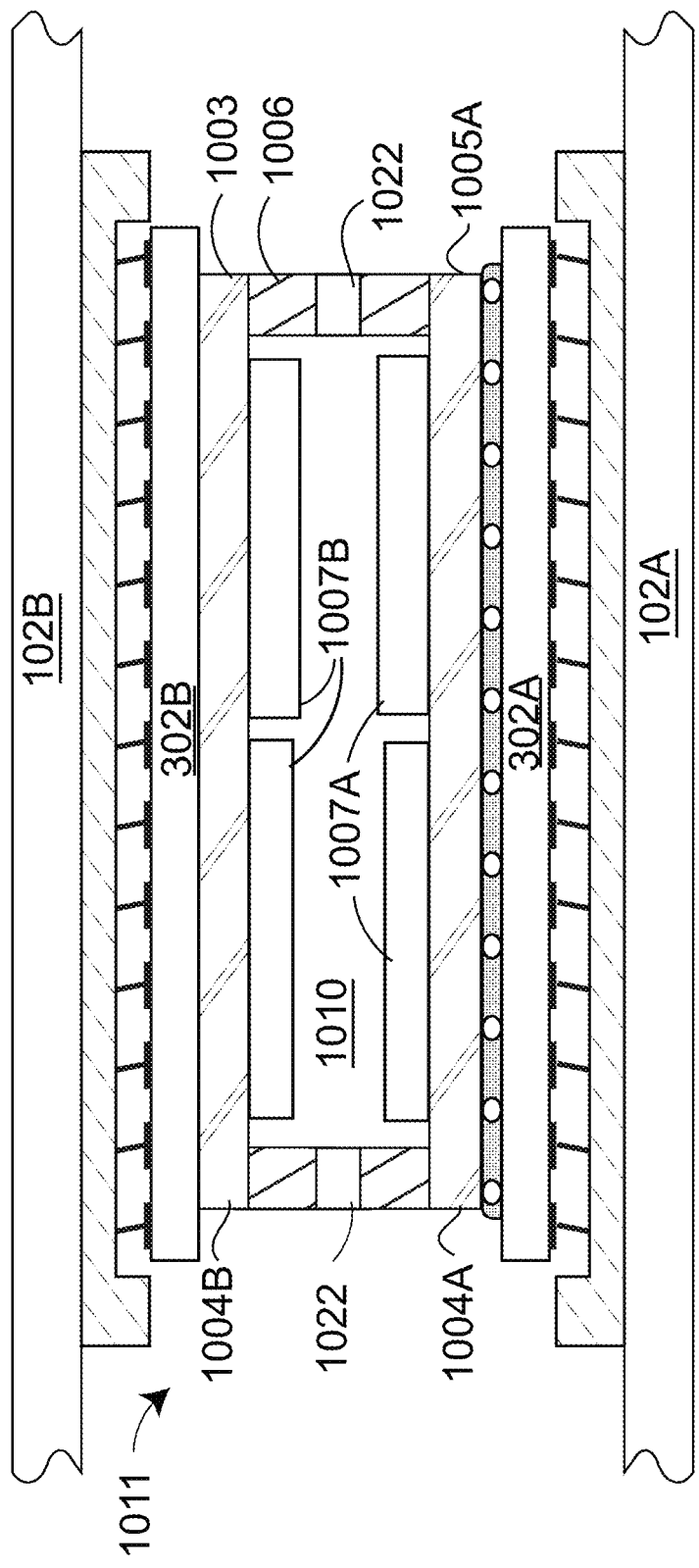
FIG. 10C is a schematic sectional view of a device package, in accordance with embodiments of the disclosure.

FIG. 10C is a schematic side sectional view of a device package 1011 with a coolant channel 1010 is disposed between a first HI device 1004A and a second HI device 1004B of an integrated cooling assembly 1003, where the first HI device 1004A is electrically connected to a first package substrate 302A and the second device 1004B is electrically connected to a second package substrate 302B. In those embodiments, the device package 1011 may be disposed between and connected opposing PCB 102A-B.

Figure 11:
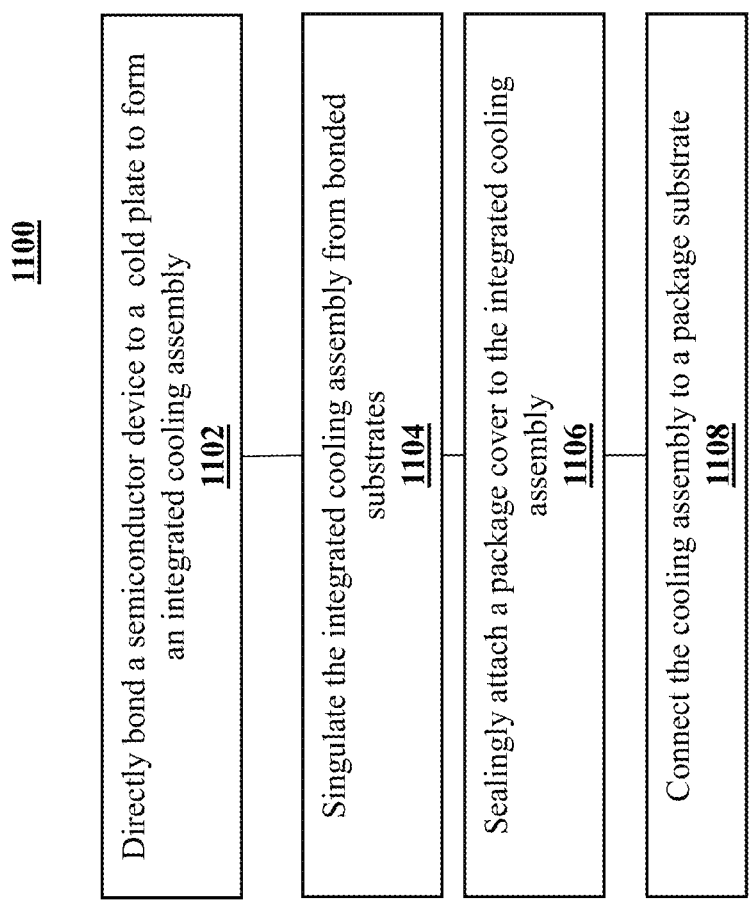
FIG. 11 diagrams a method of manufacturing a device package, in accordance with embodiments of the disclosure.
Figure 12:
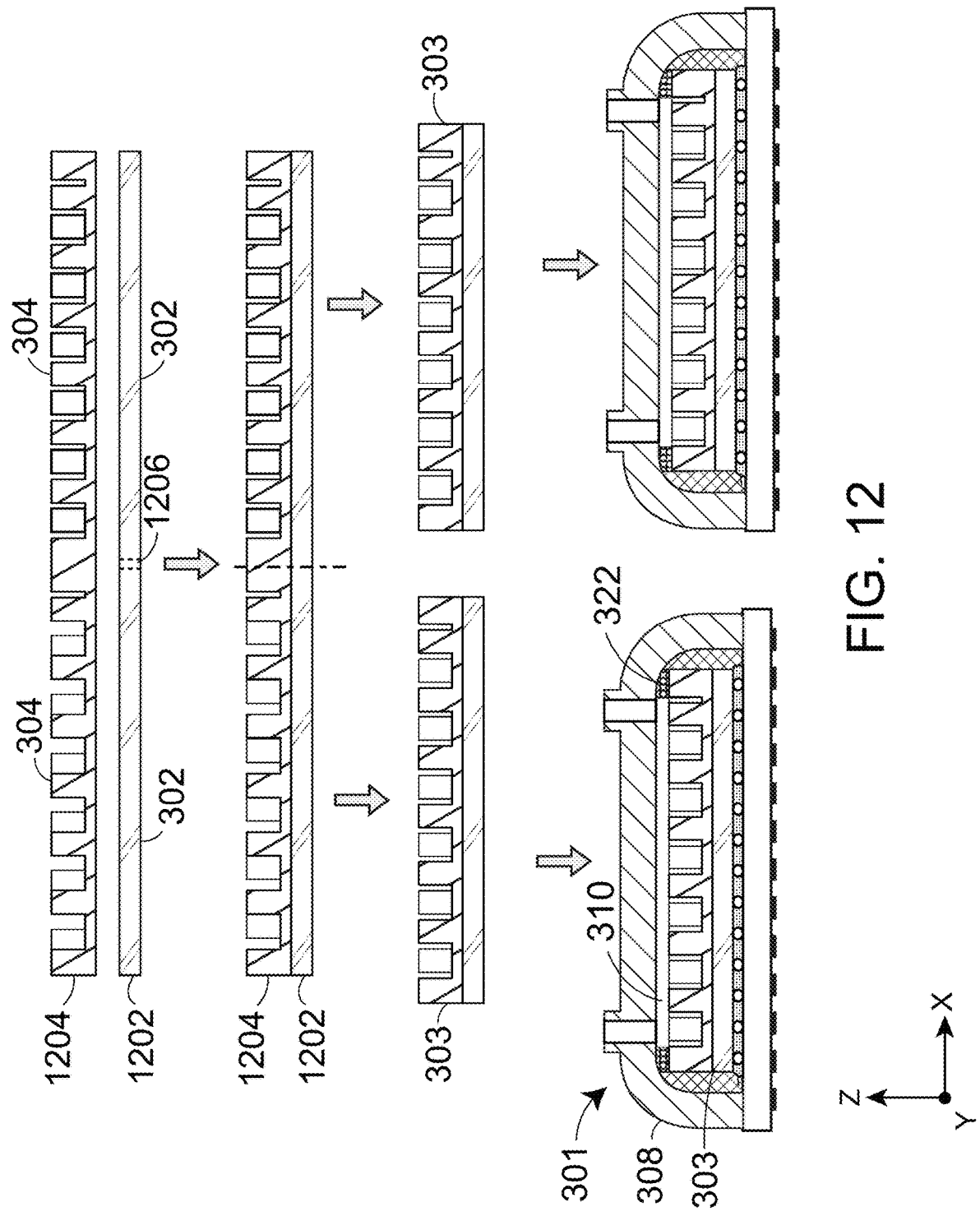
FIG. 12 illustrates an example device package at different stages of the method in FIG. 11.

FIG. 11 shows a method 1100 that can be used to manufacture the device packages described herein. FIG. 12 uses the device package 301 at different stages of the manufacturing process to illustrate aspects of the method 1100. At least some of the features of the device package 301 described below can be found with referenced to FIG. 3. It is contemplated, however, that the method 1100 can be used to manufacture any of the device packages described herein. At block 1102, the method 1100 includes aligning a first substrate 1202 with a second substrate 1204, where the first substrate 1202 includes a plurality of to-be-singulated die, e.g., devices 304, and the second substrate 1204 includes a plurality of to-be-singulated cold plates 306. The cold plates 306 may be formed from one or more base plates 924a-b (two shown), according to any one of the embodiments described above in FIGS. 4-7. As shown, the first substrate 1202 includes a plurality of the devices 304 arranged in a rectangular array and spaced apart from one another by a plurality of scribe lines 1206 that extend in the X and Y directions to form a grid pattern.

The first substrate 1202 may include a bulk material and a plurality of material layers disposed on the bulk material. The bulk material may include any semiconductor material suitable for manufacturing semiconductor devices, such as silicon, silicon germanium, germanium, group III-V semiconductor materials, group II-VI semiconductor materials, or combinations thereof. For example, in some embodiments, the first substrate 1202 may include a monocrystalline wafer, such as a silicon wafer, a plurality of device components formed in or on the silicon wafer, and a plurality of interconnect layers formed over the plurality of device components. In other embodiments, the substrate may comprise a reconstituted substrate, e.g., a substrate formed from a plurality of singulated devices embedded in a support material.

The bulk material of the first substrate 1202 may be thinned after the devices 304 are formed using one or more backgrind, etching, and polishing operations that remove material from the backside. Thinning the first substrate 1202 may include using a combination of grinding and etching processes to reduce the thickness (in the Z-direction) to about 450 μm or less, such as about 301 μm or less, or about 150 μm or less. After thinning, the backside may be polished to a desired smoothness using a chemical mechanical polishing (CMP) process, and the dielectric material layer may be deposited thereon. In some embodiments, the dielectric material layer may be polished to a desired smoothness to prepare the substrate 1202 for the bonding process. In some embodiments, the method 1100 includes forming the plurality of metal features in the dielectric material layer in preparation for a hybrid bonding process, such as by use of a damascene process.

In some embodiments, the active side is temporarily bonded to a carrier substrate (not shown) before or after the thinning process. When used, the carrier substrate provides support for the thinning operation and/or for the thinned material to facilitate substrate handling during one or more of the subsequent manufacturing operations described herein. In some embodiments, the second substrate 1204 is formed of a plurality of substrates (not shown), each comprising a unitary bulk material patterned to define a plurality of plates, such as the first and second plates 806A-B of the integrated cooling assembly 803 of FIG. 8B. Each of the plurality of substrates may have substantially the same size and shape as the first substrate 1202 when viewed from top-down (in the Z-direction) so that the interfacing surfaces are substantially coextensive with one another. In some embodiments, each of the substrates has a thickness (in the Z-direction) of between about 0.5 mm and about 10 mm, or between about 1 mm and about 8 mm, or between about 1 mm and 6 mm, such as about 0.5 mm or more, such as about 1 mm or more, or about 2 mm or more, or about 10 mm or less, such as about 8 mm or less, or about 6 mm or less.

In some embodiments, the second substrate 1204 is formed of a bulk material having a substantially similar coefficient of linear thermal expansion (CTE) to the bulk material of the first substrate 1202, where the CTE is a fractional change in length of the material (in the X-Y plane) per degree of temperature change. In some embodiments, the CTEs of the first and second substrates are matched so that the CTE of the second substrate 1204 is within about +/−20% or less of the CTE of the first substrate 1202, such as within +/−15% or less, within +/−10% or less, or within about +/−5% or less when measured across a desired temperature range. In some embodiments, the CTEs are matched across a temperature range from about −60° C. to about 200° ° C., or from about 60° ° C. to about 175° C. In one example embodiment, the matched CTE materials each include silicon. For example, the bulk material of the first substrate 1202 may include monocrystalline silicon, and the bulk material of the second substrate 1204 may include monocrystalline silicon or polycrystalline silicon. In some embodiments, the method 1100 includes forming a dielectric material layer and, optionally, a plurality of metal features on the lower surface of the second substrate 1204.

At block 1104, the method 1100 includes directly bonding the plurality of cold plates 306 formed in the second substrate 1204 to the plurality of devices 304 in the first substrate 1202. As described above, the bonding surfaces may each comprise a dielectric material layer, and directly bonding the first and second substrates 1202, 1204 includes forming dielectric bonds between the first dielectric material layer 334A and the second dielectric material layer 334B. Optionally, the first and second substrates 1202, 1204 may be directly bonded using a hybrid of the dielectric bonds and metal bonds formed between the metal features.

Generally, directly bonding the surfaces (of the dielectric material layers) includes preparing, aligning, and contacting the surfaces. Preparing the surfaces may include smoothing the respective surfaces to a desired surface roughness, such as between 0.1 to 3.0 nm RMS, activating the surfaces to weaken or open chemical bonds in the dielectric material, and terminating the surfaces with a desired species. Smoothing the surfaces may include polishing the substrates 1202, 1204 using a chemical mechanical polishing (CMP) process.

Activating and terminating the surfaces with a desired species may include exposing the surfaces to radical species formed in a plasma.

In some embodiments, the plasma is formed using a nitrogen-containing gas, e.g., $N_2$, and the terminating species includes nitrogen and hydrogen. In some embodiments, the surfaces may be activated using a wet cleaning process, e.g., by exposing the surfaces to an aqueous ammonia solution. In some embodiments, the dielectric bonds may be formed using a dielectric material layer deposited on only one of the substrates 1202, 1204 but not on both. In those embodiments, the direct dielectric bonds may be formed by contacting the deposited dielectric material layer of one substrate directly with a bulk material surface of the other substrate, e.g., a bulk semiconductor or poly-silicon material surface. In such embodiments, the bulk material surface may comprise a thin layer of native oxide or may be cleaned prior to contact so that it is substantially free of native oxide.

Directly forming direct dielectric bonds between the substrates at block 1104 includes bringing the prepared and aligned surfaces into direct contact at a temperature less than 150° C., such as less than 100° C., for example, less than 30° C., or about room temperature, e.g., between 20° C. and 30° C. Without intending to be bound by theory, it is believed that the hydrogen terminating species diffuse from the interfacial bonding surfaces, and chemical bonds are formed between the remaining nitrogen species during the direct bonding process. In some embodiments, the direct bond is strengthened using an anneal process, where the substrates are heated to and maintained at a temperature of greater than about 30° C. and less than about 450° C., for example, greater than about 50° C. and less than about 250° C., or about 150° C. for a duration of about 5 minutes or more, such as about 15 minutes. Typically, the bonds will strengthen over time even without the application of heat. Thus in some embodiments, the method does not include heating the substrates.

In embodiments where the substrates are bonded using hybrid dielectric and metal bonds, the method may further include planarizing or recessing the metal features below the field surface before contacting and bonding the dielectric material layers. After the dielectric bonds are formed, the substrates 1202, 1204 may be heated to a temperature of 150° C. or more and maintained at the elevated temperature for a duration of about 1 hour or more, such as between 8 and 24 hours, to form direct metallurgical bonds between the metal features. Suitable direct dielectric and hybrid bonding technologies that may be used to perform aspects of the methods described herein include ZiBond® and DBI®, each of which are commercially available from Adeia Holding Corp., San Jose, CA, USA.

At block 1106, the method 1100 includes singulating the plurality of integrated cooling assemblies 303 from the bonded substrates. Singulation after bonding imparts distinctive structural characteristics on the integrated cooling assemblies 303 as the bonding surface of each cold plate 306 has the same perimeter as the backside of the device 304 bonded thereto. Thus, the sidewalls of the cold plate 306 are typically flush with the edges of the device 304 about their common perimeters. In some embodiments, the cold plates 306 are singulated from the second substrate 1204 using a process that cuts or divides the second substrate 1204 in a vertical plane, i.e., parallel to the Z-direction. In those embodiments, the sides of the cold plates 306 are substantially perpendicular to the backside of the device, i.e., a horizontal (X-Y) plane of an attachment interface between the device 304 and the cold plate 306. In some embodiments, the cold plates 306 are singulated using a saw or laser dicing process.

At block 1108, the method includes connecting the integrated cooling assembly to the package substrate 302 and attaching the package cover 308 to the integrated cooling assembly 303 with the adhesive layer 322. In some embodiments, the method further includes at least partially encapsulating the integrated cooling assembly 303 with a second underfill layer 338.

The methods described above advantageously provide for embedded cold plates that eliminate and/or substantially reduce the thermal resistance pathway typically associated with cooling systems attached to the exterior of a device package. The cold plates may be attached to a semiconductor device using a direct dielectric or hybrid dielectric and metal bonding method. Such bonding methods allow for relatively low thermal budgets while providing substantially increased bonding strengths when compared to conventional silicon-to-silicon bonding methods, such as thermocompression bonding methods.

The cold plate and the semiconductor device may be formed of CTE matched materials which eliminates the need for an intervening TIM layer. The cold plate and the package cover may be formed of CTE mismatched materials and attached to one another using a flexible adhesive material. The flexible adhesive material absorbs the difference in linear expansion between the package cover and the cold plate during repeated thermal cycles to extend the useful lifetime of the device package.

This specification discloses embodiments which include, but are not limited to, the following:

The embodiments discussed above are intended to be illustrative and not limiting. One skilled in the art would appreciate that individual aspects of the cooling assemblies, device packages, and methods discussed herein may be omitted, modified, combined, and/or rearranged without departing from the scope of the invention. Only the claims that follow are meant to set bounds as to what the present invention includes.

What is claimed is:

1. A device package comprising:
a package substrate;
a package cover disposed on the package substrate;
an integrated cooling assembly disposed between the package substrate and the package cover, the integrated cooling assembly comprising a semiconductor device and a cold plate, the cold plate comprising a first side attached to the semiconductor device and a second side opposite the first side, wherein the cold plate is attached to the semiconductor device by direct dielectric bonds; and
an adhesive layer disposed between the package cover and the second side of the cold plate, wherein:
one or more surfaces of the second side of the cold plate are spaced apart from the package cover to define a coolant channel therebetween;
the adhesive layer comprises a first portion that seals the package cover to the cold plate around a perimeter of the coolant channel and a second portion disposed inward of the perimeter of the coolant channel; and
the second portion of the adhesive layer attaches inner surfaces of the cold plate to the corresponding portions of the package cover disposed thereover.

2. The device package of claim 1, wherein the cold plate is attached to the semiconductor device by direct hybrid bonds.

3. The device package of claim 1, further comprising a coolant fluid disposed in the coolant channel.

4. The device package of claim 1, wherein the coolant channel forms a fluid pathway between an inlet and outlet openings disposed through the package cover.

5. The device package of claim 1, further comprising an underfill layer that at least partially encapsulates the integrated cooling assembly in regions outside of the coolant channel.

6. The device package of claim 1, wherein:
the second side of the cold plate comprises a base surface and sidewalls that surround the base surface and extend upwardly therefrom to form a cavity; and
the first portion of the adhesive layer is disposed between the sidewalls and the package cover.

7. A device package comprising:
a package substrate;
a package cover disposed on the package substrate;
an integrated cooling assembly disposed between the package substrate and the package cover, the integrated cooling assembly comprising a semiconductor device and a cold plate, the cold plate comprising a first side attached to the semiconductor device and a second side opposite the first side, wherein the cold plate is attached to the semiconductor device by direct dielectric bonds; and
an adhesive layer disposed between the package cover and the second side of the cold plate, wherein:
one or more surfaces of the second side of the cold plate are spaced apart from the package cover to define a coolant channel therebetween;
the adhesive layer comprises a first portion that seals the package cover to the cold plate around a perimeter of the coolant channel;
the second side of the cold plate comprises a base surface and sidewalls that surround the base surface and extend upwardly therefrom to form a cavity;
the first portion of the adhesive layer is disposed between the sidewalls and the package cover; and
the adhesive layer further comprises one or more second portions attaching the cold plate and the package cover in one or more locations inward of the perimeter of the coolant channel.

8. The device package of claim 6, wherein the second side of the cold plate further comprises a plurality of protruding features that extend upwardly from the base surface.

9. The device package of claim 8, wherein the protruding features comprise a thermally conductive metal.

10. The device package of claim 1, wherein the integrated cooling assembly further comprises a thermoelectric cooler disposed between a hotspot region of the semiconductor device and portion of the cold plate disposed over the hotspot region.

11. A device package comprising:
a package substrate;
a package cover disposed on the package substrate;
an integrated cooling assembly disposed between the package substrate and the package cover, the integrated cooling assembly comprising a semiconductor device and a cold plate, the cold plate comprising a first side attached to the semiconductor device and a second side opposite the first side, wherein the cold plate is attached to the semiconductor device by direct dielectric bonds; and
an adhesive layer disposed between the package cover and the second side of the cold plate, wherein:
one or more surfaces of the second side of the cold plate are spaced apart from the package cover to define a coolant channel therebetween;
the adhesive layer seals the package cover to the cold plate around a perimeter of the coolant channel;
the integrated cooling assembly further comprises a thermoelectric cooler disposed between a hotspot region of the semiconductor device and portion of the cold plate disposed over the hotspot region; and
the thermoelectric cooler is electrically coupled to the package substrate through interconnects disposed through the semiconductor device.

12. A device package comprising:
a package substrate;
a package cover disposed on the package substrate;
an integrated cooling assembly disposed between the package substrate and the package cover, the integrated cooling assembly comprising a semiconductor device and a cold plate, the cold plate comprising a first side attached to the semiconductor device and a second side opposite the first side, wherein the cold plate is attached to the semiconductor device by direct dielectric bonds; and
an adhesive layer disposed between the package cover and the second side of the cold plate, wherein:
one or more surfaces of the second side of the cold plate are spaced apart from the package cover to define a coolant channel therebetween;
the adhesive layer seals the package cover to the cold plate around a perimeter of the coolant channel;
the integrated cooling assembly further comprises a thermoelectric cooler disposed between a hotspot region of the semiconductor device and portion of the cold plate disposed over the hotspot region;
the second side of the cold plate comprises a plurality of protruding features; and
a pattern density, size, and/or shape of the protruding features in a region above the thermoelectric cooler is different from adjacent regions.

13. The device package of claim 10, wherein the thermoelectric cooler is directly bonded to the cold plate, the semiconductor device, or both.

14. A device package comprising:
a package substrate;
a package cover disposed on the package substrate;
an integrated cooling assembly disposed between the package substrate and the package cover, the integrated cooling assembly comprising a semiconductor device and a cold plate, the cold plate comprising a first side attached to the semiconductor device and a second side opposite the first side, wherein the cold plate is attached to the semiconductor device by direct dielectric bonds; and
an adhesive layer disposed between the package cover and the second side of the cold plate, wherein:
one or more surfaces of the second side of the cold plate are spaced apart from the package cover to define a coolant channel therebetween;
the adhesive layer seals the package cover to the cold plate around a perimeter of the coolant channel;
the second side of the cold plate comprises a base surface and sidewalls that surround the base surface and extend upwardly therefrom to form a cavity;
the adhesive layer is disposed between the sidewalls and the package cover; and an inward facing surface of the package cover comprises a continuous well-region sized and shaped to receive a portion of the sidewalls of the cold plate.

15. The device package of claim 14, wherein the adhesive layer comprises a compliant material that surrounds an upper portion of the sidewalls disposed in the continuous well-region.

16. The device package of claim 15, wherein:
the cold plate further comprises one or more inner supports that connect an opposing pair of the sidewalls; and
the continuous well-region is sized and shaped to receive upper portions of the inner supports.

17. The device package of claim 16, wherein the adhesive layer at least partially surrounds an upper portion of the inner supports disposed in the continuous well-region.

18. The device package of claim 16, wherein:
the cold plate comprises a first plate and a second plate directly bonded to the first plate; and
the second plate forms upper portions of the sidewalls at least partially disposed in the continuous well-region.

19. The device package of claim 7, wherein the cold plate is attached to the semiconductor device by direct hybrid bonds.

20. The device package of claim 14, wherein the cold plate is attached to the semiconductor device by direct hybrid bonds.

* * * * *